(12) United States Patent
Kashimoto et al.

(10) Patent No.: US 7,073,163 B2
(45) Date of Patent: Jul. 4, 2006

(54) METHOD OF SIMULATING PATTERNS, COMPUTER PROGRAM THEREFOR, MEDIUM STORING THE COMPUTER PROGRAM AND PATTERN-SIMULATING APPARATUS

(75) Inventors: Noboru Kashimoto, Saitama-ken (JP); Yoshiharu Itsuki, Saitama-ken (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 345 days.

(21) Appl. No.: 10/768,102

(22) Filed: Feb. 2, 2004

(65) Prior Publication Data

US 2004/0158809 A1 Aug. 12, 2004

(30) Foreign Application Priority Data

Feb. 10, 2003 (JP) ............................. 2003-032602

(51) Int. Cl.
*G06F 17/50* (2006.01)
(52) U.S. Cl. ............................ 716/21; 716/4; 716/19
(58) Field of Classification Search .................... None
See application file for complete search history.

(56) References Cited

U.S. PATENT DOCUMENTS

| | | | |
|---|---|---|---|
| 5,694,325 A * | 12/1997 | Fukuda et al. | 700/121 |
| 6,453,452 B1 * | 9/2002 | Chang et al. | 716/8 |
| 6,578,188 B1 * | 6/2003 | Pang et al. | 716/19 |
| 6,775,818 B1 * | 8/2004 | Taravade et al. | 716/21 |
| 6,789,250 B1 * | 9/2004 | Watanabe et al. | 716/19 |
| 6,966,047 B1 * | 11/2005 | Glasser | 716/19 |

FOREIGN PATENT DOCUMENTS

JP 2002-367890 12/2002

* cited by examiner

*Primary Examiner*—Leigh M. Garbowski
(74) *Attorney, Agent, or Firm*—Oblon, Spivak, McClelland, Maier & Neustadt, P.C.

(57) ABSTRACT

A pattern simulation method includes reticle data and exposure data. The reticle data contain reticle patterns for regions into which an entire pattern is divided. The exposure data are composed of positioning data for reticle patterns to be exposed on a substrate. A substrate pattern is formed on the substrate in accordance with the reticle data and the exposure data. OR logic operations are executed for patterns corresponding to regions of the substrate pattern exposed on the substrate to simulate exposure patterns on the substrate. Design defects of the reticle data or the exposure data can be easily found by checking of simulation patterns corresponding to regions which are not exposed on the substrate when the substrate pattern is formed on the substrate in accordance with the reticle data and the exposure data.

18 Claims, 22 Drawing Sheets

METHOD OF SIMULATING PATTERNS, COMPUTER PROGRAM THEREFOR, MEDIUM STORING THE COMPUTER PROGRAM AND PATTERN-SIMULATING APPARATUS

FIELD OF THE INVENTION

This invention generally relates to a method of simulating patterns formed on a substrate by applying lithographic exposure, its computer program, a medium for storing the program, and a pattern-simulation apparatus.

This application is based upon and claims the benefit of priority from the prior Japanese Patent Application No. 2003-32602, filed on Feb. 10, 2003, the entire contents of which are incorporated herein by reference.

BACKGROUND OF THE INVENTION

In general, a liquid crystal display ("LCD") device contains wiring such as scanning and signal lines, pixel electrodes, and switching elements such as thin film transistors. In order to make the wiring, electrodes and switching elements, thin films of conductive and dielectric materials are first formed on a substrate in a film-forming process. The thin films are then coated with a photoresist in a coating process. The coated thin films are optically exposed through patterned reticles in an exposing process. The exposed thin films are developed and etched in developing and etching processes, respectively, to remove the exposed thin films. These processes are repeated, if necessary, to form such wiring, electrodes and switching elements as designed.

With a recent trend of larger size LCD devices, a divided exposure process has been implemented. The divided exposure process is performed by dividing a large substrate into a plurality of regions and exposing in turn the regions through corresponding reticles. In the divided exposure process, there are regions with a width of 3μ to 10μ on divided lines. The regions are called multiple exposure regions, which are subject to a plurality of exposures in an overlapped exposing process.

Reticles as photomasks used for the divided exposure process are designed by employing a computer aided design (CAD) system. For design of reticle patterns, a pattern of an LCD panel size is determined in compliance with a design standard for an LCD device and, then, the pattern is divided depending on reticle sizes and the number of reticles. Here, division lines to divide the patterns are provided along places that have substantially no influence on LCD characteristics.

Further, design data on divided exposures of LCD panels are stored in a memory of the CAD system server. Based on the design data, reticle patterns are formed to meet requirements for design patterns of the LCD panels and division lines. Finally, light-shielding band patterns are added to the reticle patterns. The photomasks are completed in this way.

The substrate is exposed to form a plurality of LCD panel patterns through the photomasks, i.e., reticles positioned by using coordinates and other relevant data collectively called the exposure data. In other words, the exposure data contain ranges of exposure regions on the reticles, data indicating the center points as reference, coordinates data of the substrate to be exposed so that ranges designated on the reticles are exposed on the substrate (see Japanese Patent Disclosure 2002-367890, pages 2–4, and FIGS. 1–10).

When exposure data are, however, mistakenly entered into the CAD system for the divided exposure process, although such mistake may be found at an error processing step, it may not be detected until a pattern inspection step performed after patterns are exposed and formed on the substrate.

Further, when the division of reticles is made in error and boundaries between neighboring reticles are not consistent with each other, patterns formed on the substrate short-circuit or are broken so that the substrate is poor in quality. Particularly, when division lines are made zigzag in shape and are provided with buffer regions in order to make the lines hardly seen, it is not easy to find out patterns mistakenly formed on the substrate.

SUMMARY OF THE INVENTION

Accordingly, the present invention is for solving the problem set forth above and provides a method of simulating patterns in which design mistakes in reticles and/or exposure data are easily detectable, its computer program, a medium for storing the program, and a pattern-simulation apparatus.

One aspect of the present invention is directed to a method of simulating substrate patterns which prepares reticle data of reticle patterns for a plurality of divided regions of an entire pattern formed on a substrate and exposure data to position the reticle patterns on the substrate for exposure and executes an OR or AND logic operation of patterns corresponding to regions exposed on the substrate through the reticle patterns to simulate patterns of regions exposed on the substrate more than once.

This pattern. simulation method identifies patterns corresponding to regions which are not exposed when a substrate pattern is formed on a substrate in accordance with the reticle and exposure data.

Another aspect of the present invention is directed to a method of simulating substrate patterns which includes reticle data of reticle patterns for a plurality of divided regions of an entire pattern formed on a substrate and exposure data for positioning of the reticle patterns on the substrate for exposure, makes an inference pattern corresponding to a substrate pattern on the assumption that the substrate pattern is formed in accordance with said reticle and exposure data, executes a logic operation of the inference pattern and patterns corresponding to a substrate pattern formed in accordance with the reticle and exposure data to make differentiated patterns to express difference between the inference pattern and patterns corresponding to exposure patterns of the substrate pattern, and overlaps the differentiated patterns with the inference pattern to simulate the substrate pattern.

As a result, this method also identifies patterns corresponding to regions which are not to be exposed or those for which exposures are overlapped in the case that a substrate pattern is formed on the substrate in accordance with the reticle and exposure data.

BRIEF DESCRIPTION OF THE DRAWINGS

A more complete appreciation of the present invention and many of its attendant advantages will be readily obtained as the same becomes better understood by reference to the following detailed. descriptions when considered in connection with the accompanying drawings, wherein.

DESCRIPTION OF THE PREFERRED EMBODIMENTS

Figure 1:
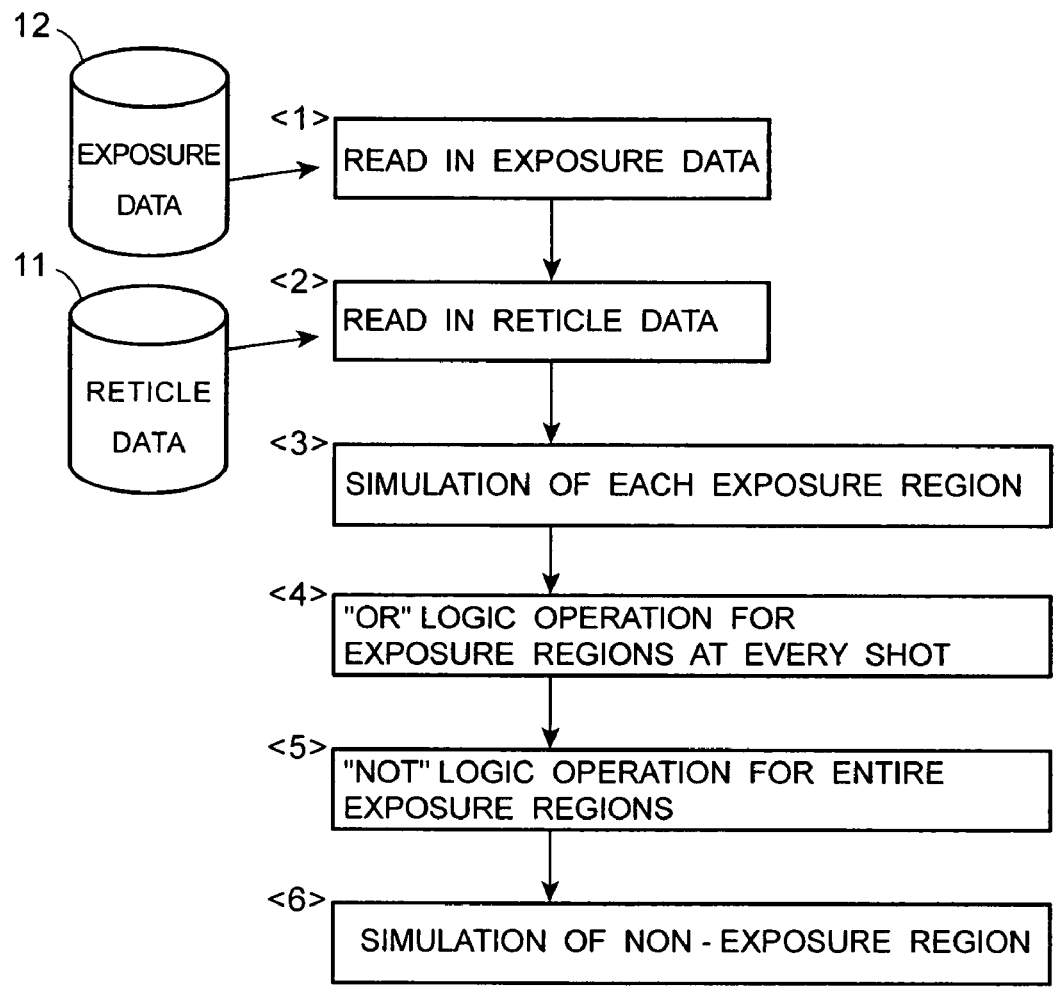
FIG. 1 is a flow chart of a method of simulating patterns in accordance with the first embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components. The drawings, however, are shown schematically for the purpose of explanation so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other. It should be also noted that, unless specifically set forth to the contrary, devices, components, materials, processes, exposures, shots, logic operations and descriptions associated with them in embodiments of the present invention are based on a computer simulation.

A method of simulating patterns of the first embodiment of the present invention will be explained below with reference to FIGS. 1–6.

Figure 2:
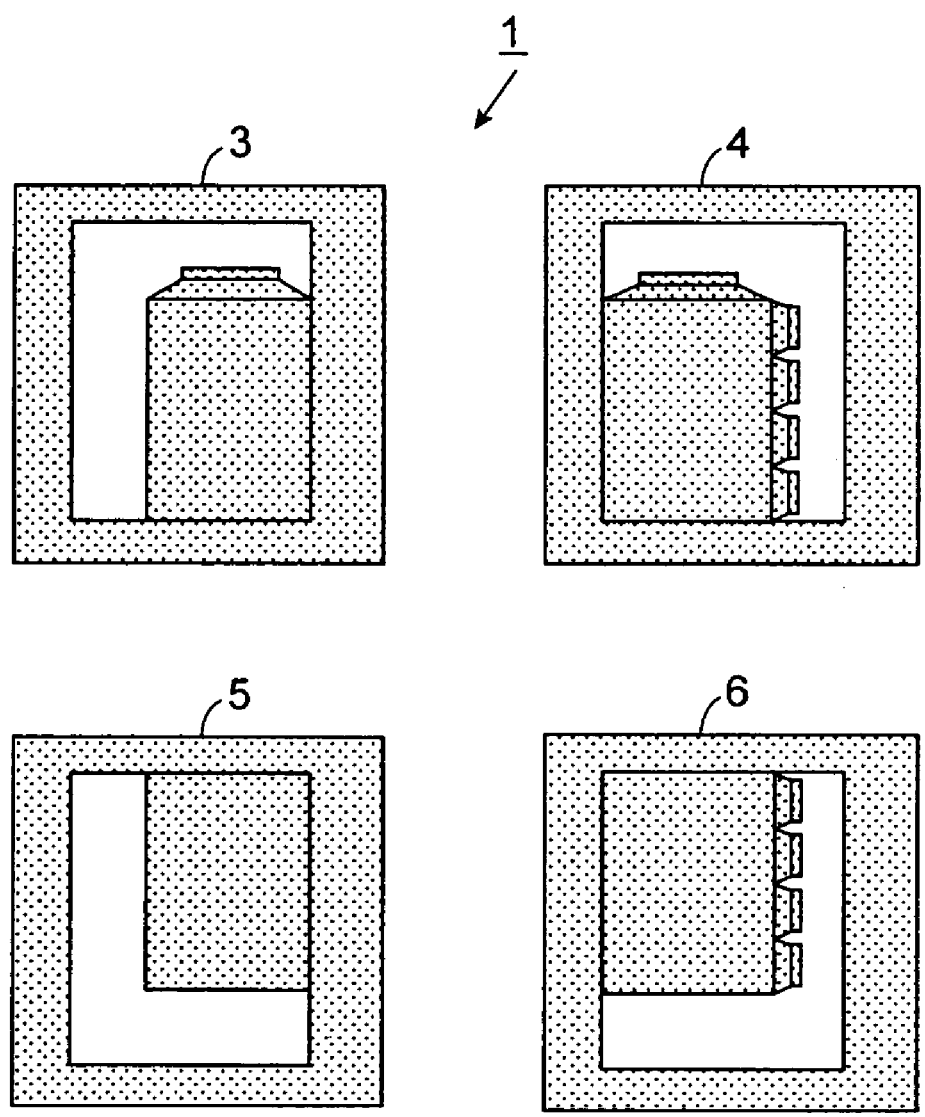
FIG. 2 shows reticles used in the method of simulating patterns shown in FIG. 1.
Figure 3:
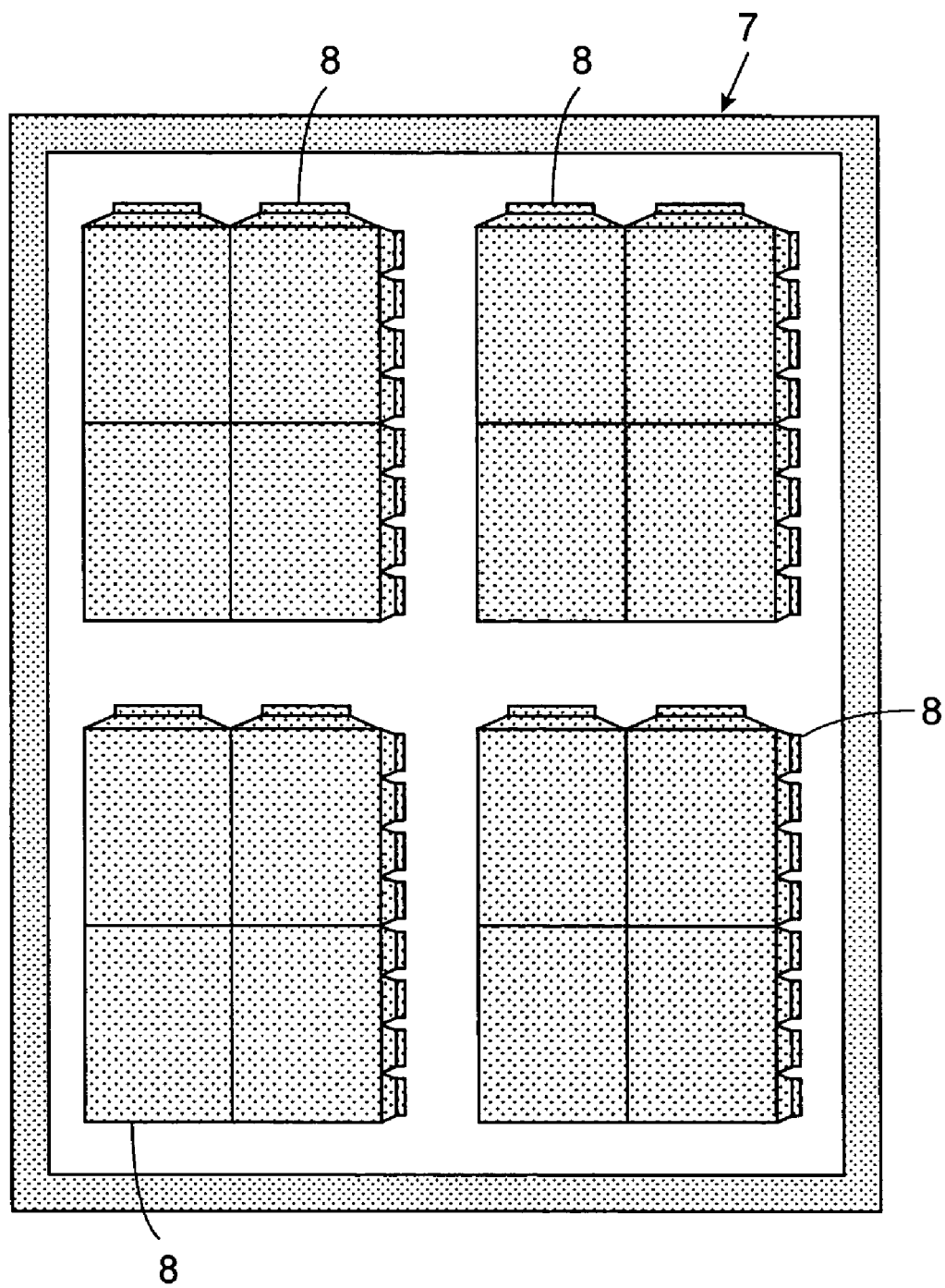
FIG. 3 shows simulation patterns formed on a substrate by the method of simulating patterns shown in FIG. 1.

A manufacturing method of LCD panels is briefly outlined to begin with. As shown in FIGS. 2 and 3, reticle patterns 1 contain a plurality of reticles, e.g., four reticles in this embodiment; the first-fourth reticles 3–6 used for divided exposures of LCD panels 8 formed on a glass substrate 7. LCD panels 8 exposed through the reticle patterns 1 are further developed and etched.

The glass substrate 7 is a 400 mm×500 mm rectangular plate, for example, on which four LCD panels 8 are formed. Each LCD panel 8 includes a display region which is also a rectangle with a diagonal length of 10.4 inches in the format of XGA (Extended Graphic Adaptor: 1024×768 pixels). LCD panel 8 is provided with at least one layer made of either an electrically conductive material or a dielectric material. Exposing shots are carried out 16 times to form four LCD panels 8 on a sheet of glass substrate 7.

As shown in FIG. 2, the first and second reticles 3 and 4 are used for exposure at the left and right side portion of the upper side of LCD panel 8, respectively. Similarly, the third and fourth reticles 5 and 6 are used for exposure at the left and right side portion of the lower side of LCD panel 8, respectively.

Electronic data of the first-fourth reticles 3–6 are referred to as reticle data 11 to individually describe reticle patterns for a plurality of regions into which an entire pattern formed on substrate 7 is divided.

Further, exposure data 12 describe the places where the reticles are disposed and shot on glass substrate 7. Exposure data 12 include data as to shooting regions in a lattice form where the first-fourth reticles 3–6 are divided and those as to the places where each shot is carried out on glass substrate 7 by using reticles 3–6. Exposure data 12 are entered at every shot but displacement data from reference coordinates are given in a lattice or matrix form in the event that the same shot is repeated. Further, exposure data 12 are numerical data decomposed and entered at every single shot as matrix input data.

Exposure data 12 are provided with data as to division lines 9 of reticle patterns 1 which are equal to all layers. Further, exposure data 12 are stored in an exposure data file, not shown, and are used to expose a predetermined place of glass substrate 7 through the reticle patterns by an exposure apparatus.

Reticle and exposure data 11 and 12 are readable by a pattern simulation computer. The pattern simulation computer stores and executes a pattern simulation program to simulate an entire exposure pattern, i.e., a substrate pattern 14 which is exposed and formed on glass substrate 7 based on reticle and exposure data 11 and 12.

Next, a simulation method of making a pattern lay-out by the pattern simulation computer will be explained below.

First, product specifications, a production line, conditions inherent to the production line, and the like are determined for the simulation. The product specifications include an outer size of a module, an LCD cell size, an LCD cell screen size, an edge frame size around the screen, an outer lead bonding (OLB) packaging size, the number of output terminals from integrated circuits disposed along X- and Y-directions and their size, and the like.

Figure 5:
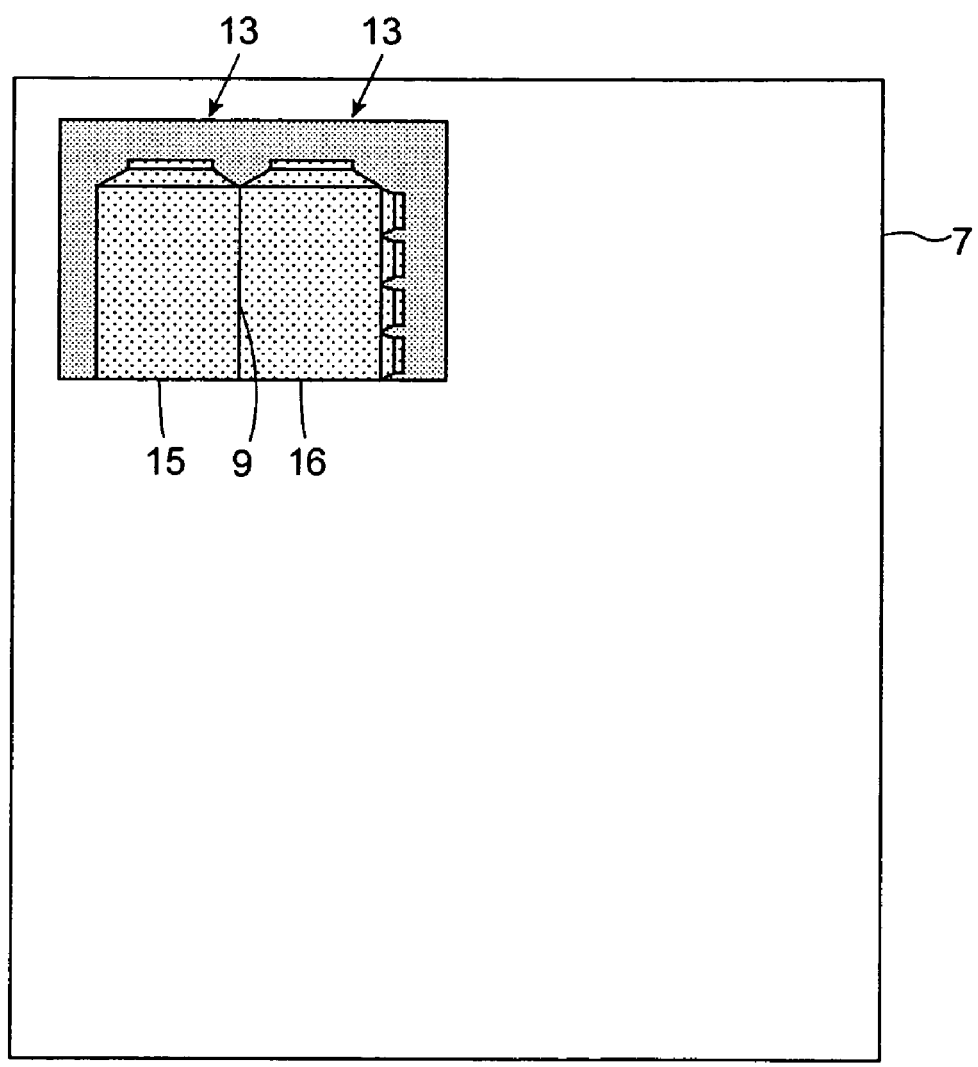
FIG. 5 shows simulation patterns formed on the substrate resulting from additional exposure directed to a part of the substrate by the method of simulating patterns shown in FIG. 1.
Figure 6:
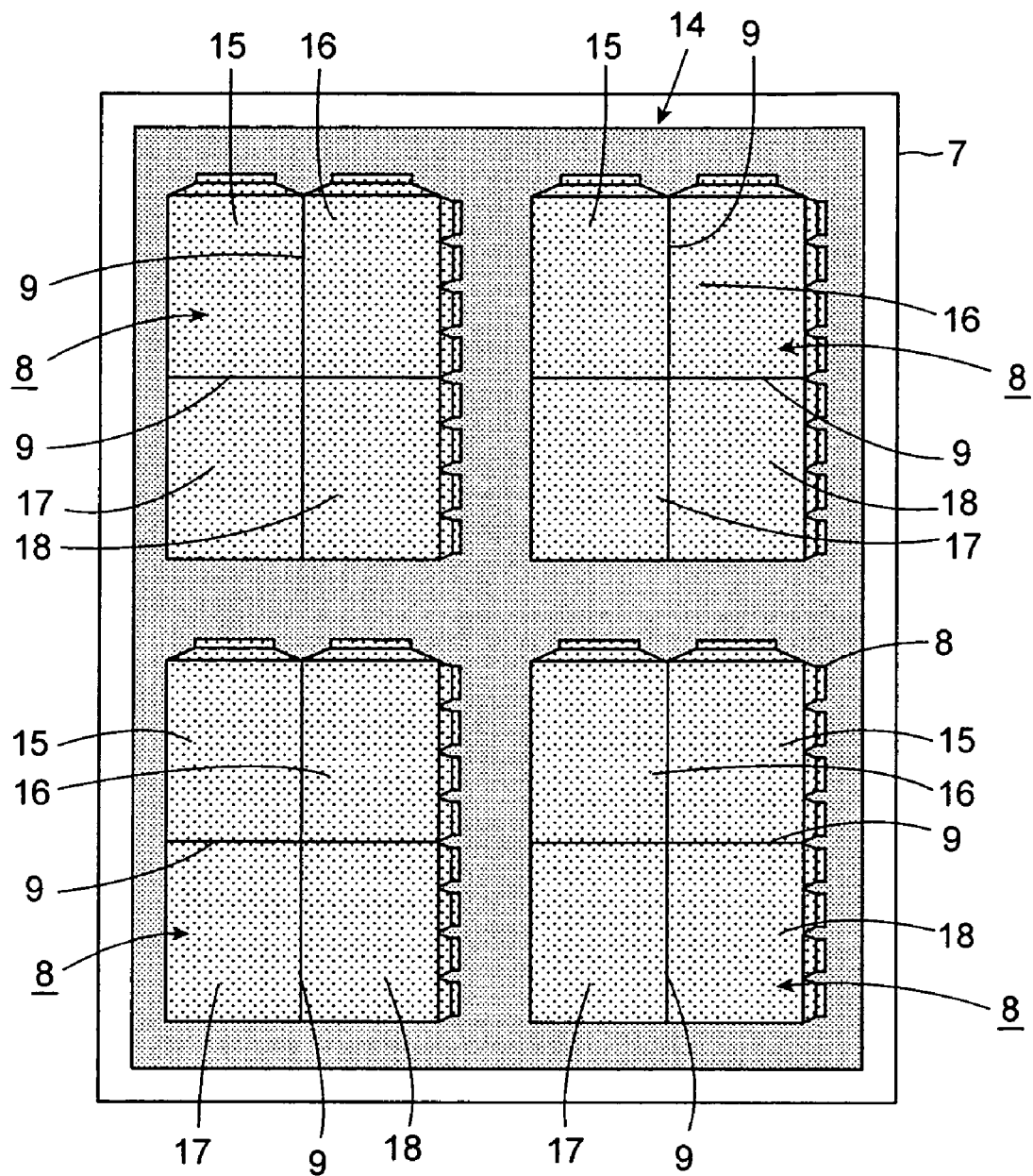
FIG. 6 shows simulation patterns resulting from exposure directed to the substrate by the method of simulating patterns shown in FIG. 1.

Next, as shown in FIGS. 5 and 6, division lines 9 for reticle patterns 1 are determined to repeat shots through identical reticles in view of a total outline pattern of a thin film transistor (TFT) array substrate supposedly formed on glass substrate 7 and the performance of the exposure apparatus.

Subsequently, each reticle pattern is formed by a CAD system based on division lines 9 while the other regions than the reticle are covered with a light-shielding pattern to prevent unnecessary regions from being exposed.

Further, completed reticle patterns each are disposed in shooting order and a detailed total pattern on the TFT array substrate is established on the CAD system by actual patterns. The computer recognizes reticle data 11 with respect to reticle patterns 1 and exposure data 12 showing relations among the first-fourth reticles 3–6 by using the detailed total pattern on the TFT array substrate and stores reticle and exposure data 11 and 12 in reticle and exposure data files of the server, respectively.

Next, a pattern simulation method by means of this pattern simulation computer will be explained below. The pattern simulation computer carries out exposures, formation of patterns, logic operations, data processing and displays on a CAD simulation basis.

With reference to FIG. 1 exposure and reticle data 12 and 11 are read in from the exposure and reticle data files by the computer (Steps <1> and <2>), respectively.

Next, base on reticle and exposure data 11 and 12 the pattern simulation program is started up. A CAD monitor displays each shooting exposure pattern 13 corresponding to what is formed on glass substrate 7 for a region exposed at every shot when substrate patterns are formed on glass substrate 7 in accordance with reticle and exposure data 11 and 12 (Step <3>).

Here, Step <3> and its subsequent Step <4> will be described with reference to FIGS. 4–6.

Figure 4:
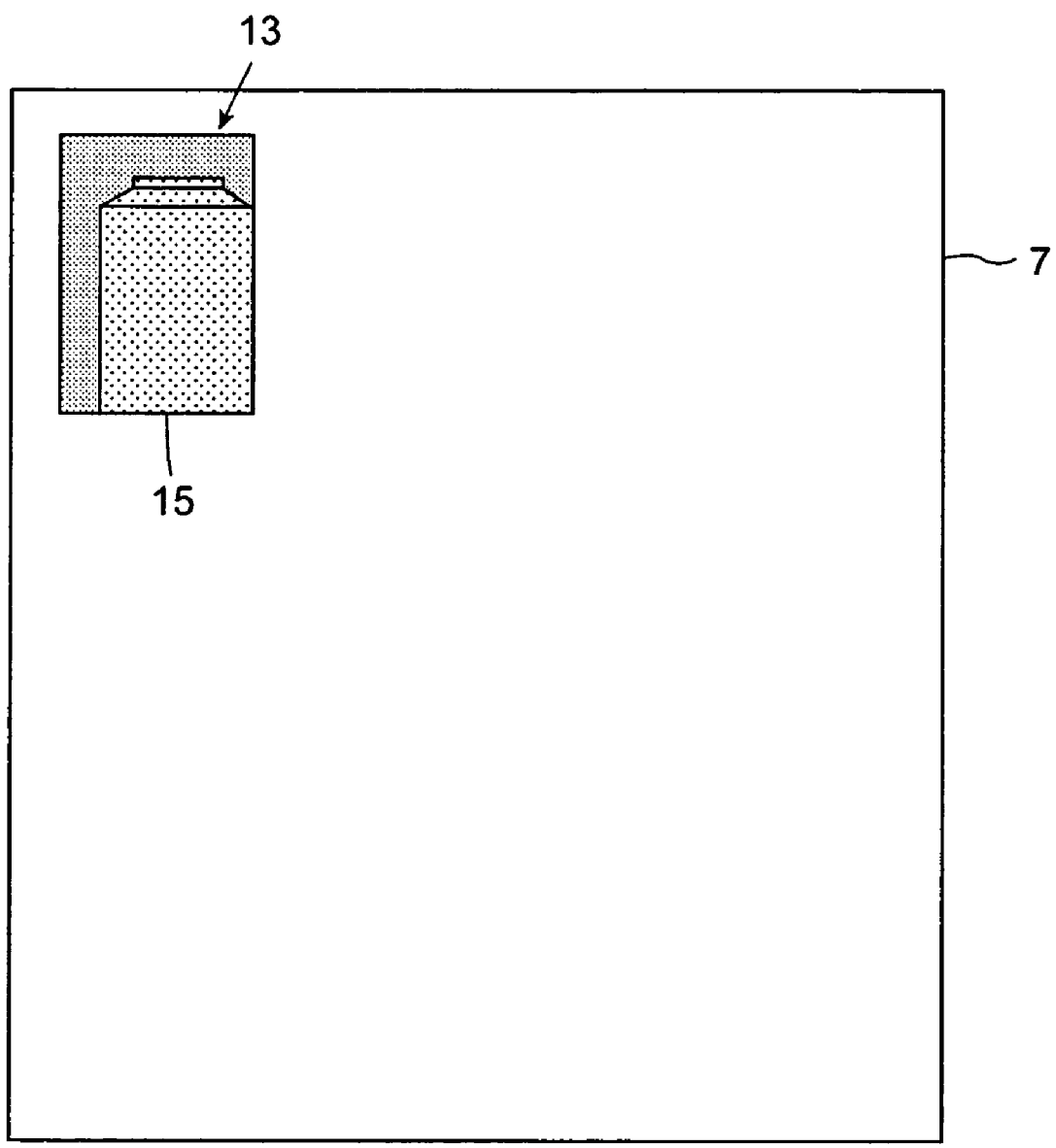
FIG. 4 shows a simulation pattern resulting from exposure directed to a part of the substrate by the method of simulating patterns shown in FIG. 1.

As shown in FIG. 4, the computer carries out a pattern simulation to form and displays the first exposure region 15 of glass substrate 7 to which light is applied when an upper left side portion of glass substrate 7 is exposed through the first reticle 3.

Further, as shown in FIG. 5, in addition to the first exposure region 15, the computer also simulates to form and displays the second exposure region 16 of glass substrate 7 to which light is applied when the upper left side portion of glass substrate 7 is exposed through the second reticle 4.

The figures of the first and second exposure regions 15 and 16 are analogous patterns to those actually depicted on glass substrate 7 by employing the first and second reticles 3 and 4 with their light-shielding patterns reversed.

In photolithography processes, however, overlapped portions of the first and second exposure regions 15 and 16 disappear during their development in the event that light is projected to photoresist materials covering the overlapped portions more than once by exposing the same through the first and second reticles 3 and 4.

Thus, the computer executes an OR logic operation for each shooting exposure pattern 13 at the time when the first and second reticles 3 and 4 are reversed, respectively, and simulates and displays entire exposure pattern 14 to which light is applied through either the first or second reticle 3 or 4 more than once (Step <4>).

The OR logic operation is not necessarily actually performed but it may be good enough to simply overlap and display each shooting exposure pattern 13 formed at the time when the first and second reticles 3 and 4 are reversed, respectively.

Similarly, the computer simulates the third exposure region 17 on glass substrate 7 to which light is applied when the upper left side portion of glass substrate 7 is exposed through the third reticle 5. The third exposure region 17 is displayed on the monitor together with the first and second exposure regions 15 and 16.

Further, the computer simulates the fourth exposure region 18 on glass substrate 7 to which light is applied when an upper left side portion of glass substrate 7 is exposed through the fourth reticle 6. The fourth exposure region 18 is displayed on the monitor together with the first, second and third exposure regions 15, 16 and 17.

Alternatively, the computer executes an OR logic operation for each shooting exposure pattern 13 at the time when the third and fourth reticles 5 and 6 are reversed, respectively, and overlaps and displays the third and fourth exposure regions 17 and 18 on the first and second exposure regions 15 and 16.

Subsequently, those Steps <3> and <4> are repeated to simulate and display the state in which four LCD panels 8 are exposed on glass substrate 7 through reticle patterns 1 as shown in FIG. 6.

Next, after summing up the patterns corresponding to all shots on glass substrate 7, the computer executes a NOT logic operation for the reversal of entire exposure pattern 14 on glass substrate 7 (Step <5>).

Then, the computer simulates and displays on the monitor regions that are reversed but not exposed on glass substrate 7, i.e., a pattern of light-shielding regions left after development or etching.

As set forth above, according to the first embodiment, the simulation computer executes the OR logic operation for each shooting exposure pattern 13 formed at the time when each of reticle patterns 1 is reversed in response to reticle data 11 and exposure data 12. The computer overlaps and displays the first-fourth exposure regions 15–18 exposed through the first-fourth reticles 3–6, respectively, as entire exposure pattern 14. Further, after summing up the patterns corresponding to all shots carried out through the first-fourth reticles 3–6 on glass substrate 7, the computer executes the NOT logic operation for entire exposure pattern 14 formed on glass substrate 7 on a simulation basis. Thus, the computer simulates and displays on the monitor light-shielding regions formed on glass substrate 7 on a simulation basis which are not exposed at all.

As a result, it is quite easy to check simulation results of such light-shielding regions when substrate patterns are formed on a glass substrate on a simulation basis in response to reticle data 11 and exposure data 12. Thus, design defects of reticle data 11 and exposure data 12 can be easily detected without any further inspection or verification which would be otherwise carried out after actual application of exposure to glass substrate 7 in accordance with reticle data 11 and exposure data 12.

Since reticle patterns 1 used for divided exposures of LCD panels 8 formed on glass substrate 7 are easily inspected in a short time, reticle patterns 1 can be readily designed and modified. An LCD device made of glass substrates is improved in productivity and yield, accordingly.

Further, in the first embodiment, the OR logic operation is executed for the shooting exposure pattern per shot at the time when each of reticle patterns 1 is reversed to form entire exposure pattern 14, the NOT logic operation is subsequently executed for entire exposure pattern 14, and light-shielding regions on glass substrate 7 are displayed on the monitor. Since it takes, however, substantial time to execute the NOT logic operation and instead of this operation, an OR logic operation is executed for a pattern corresponding to each shooting exposure pattern per shot at the time when each of reticle patterns 1 is reversed, and the first-fourth exposure regions 15–18 exposed through the first-fourth reticles 3–6, respectively, are overlapped to display entire exposure pattern 14. Consequently, when substrate patterns are formed on glass substrate 7 on simulation basis in response to reticle data 11 and exposure data 12, entire exposure pattern 14 exposed at least once on glass substrate 7 can be simulated and displayed.

As a result, other regions than entire exposure pattern 14 corresponding to those exposed at least once on glass substrate 7 become unexposed ones so that they are easily recognizable in the first embodiment. In addition, as described above, division lines 9 of reticle patterns 1 on glass substrate 7 are equal in length for all the layers, they may be or may not be different at every layer.

The second embodiment of the present invention will be explained below with reference to FIGS. 7–9.

Figure 7:
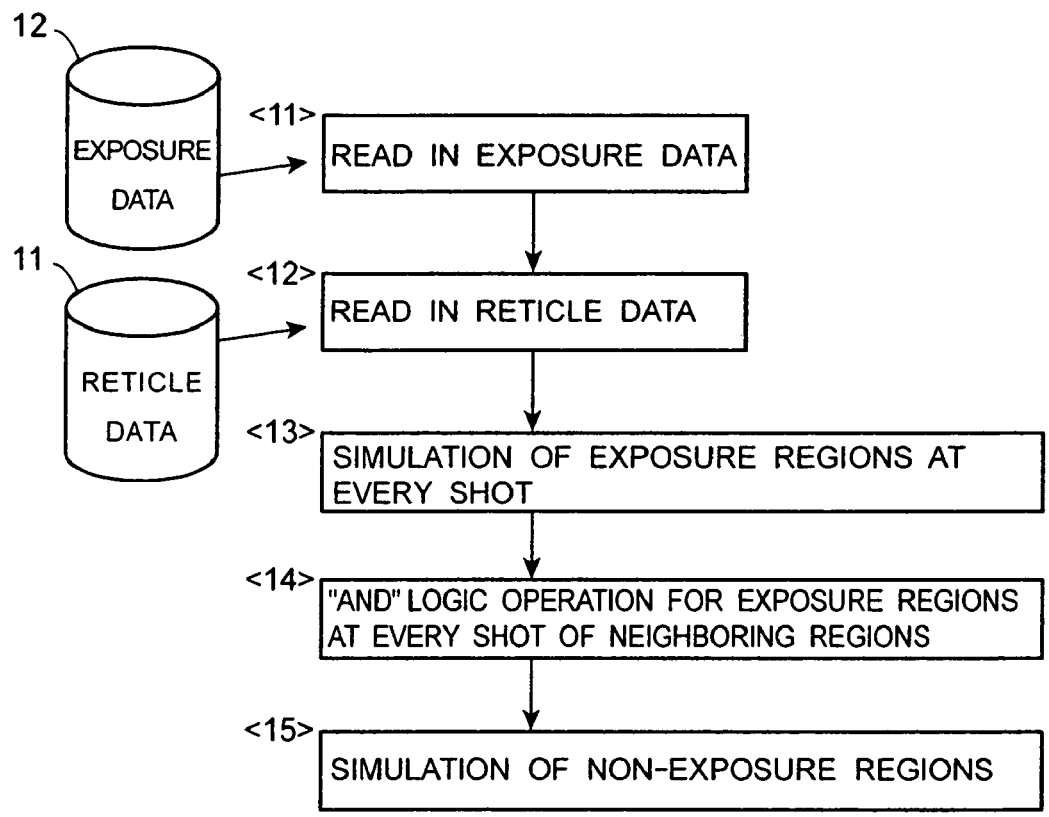
FIG. 7 is a flow chart of a method of simulating patterns in accordance with the second embodiment of the present invention.
Figure 8:
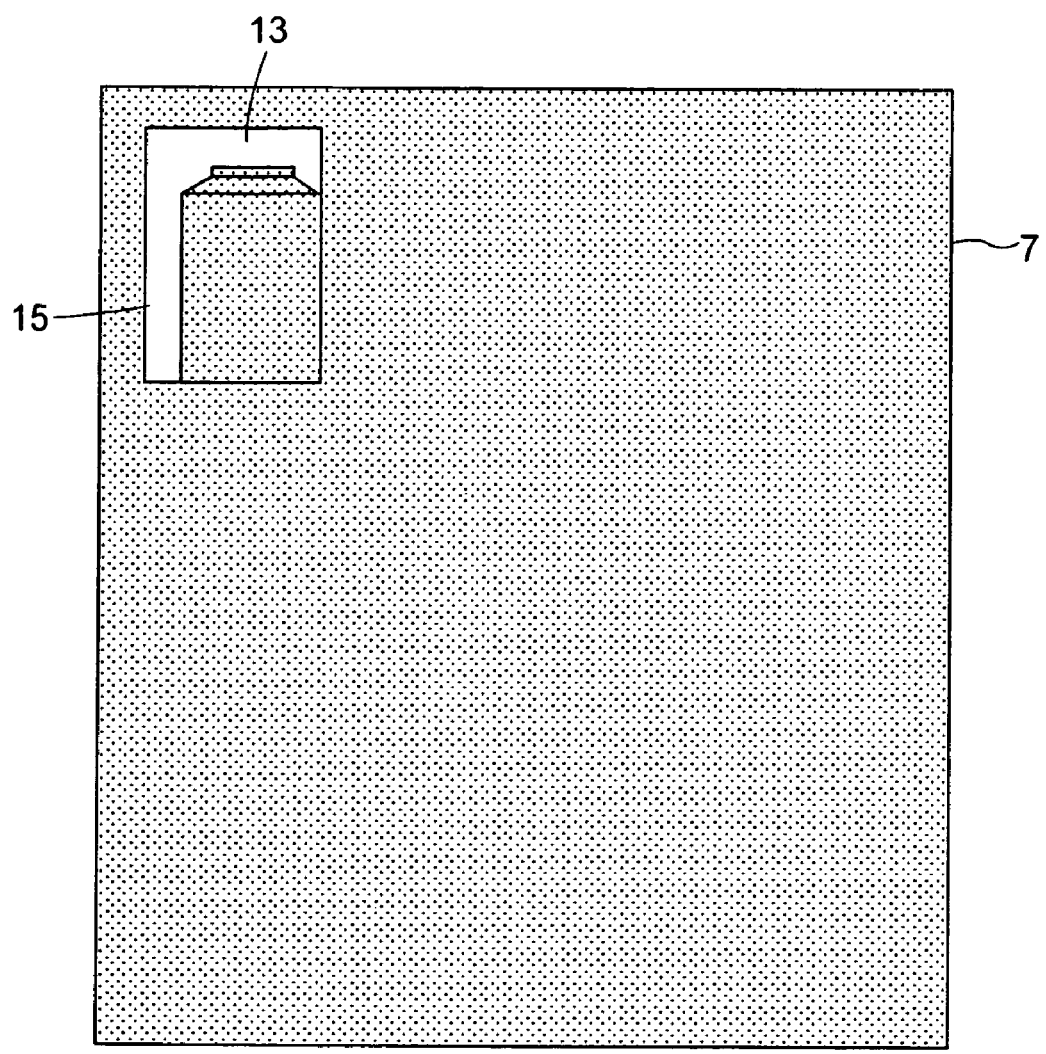
FIG. 8 shows a simulation pattern partially formed on a substrate by the method of simulating patterns shown in FIG. 7.
Figure 9:
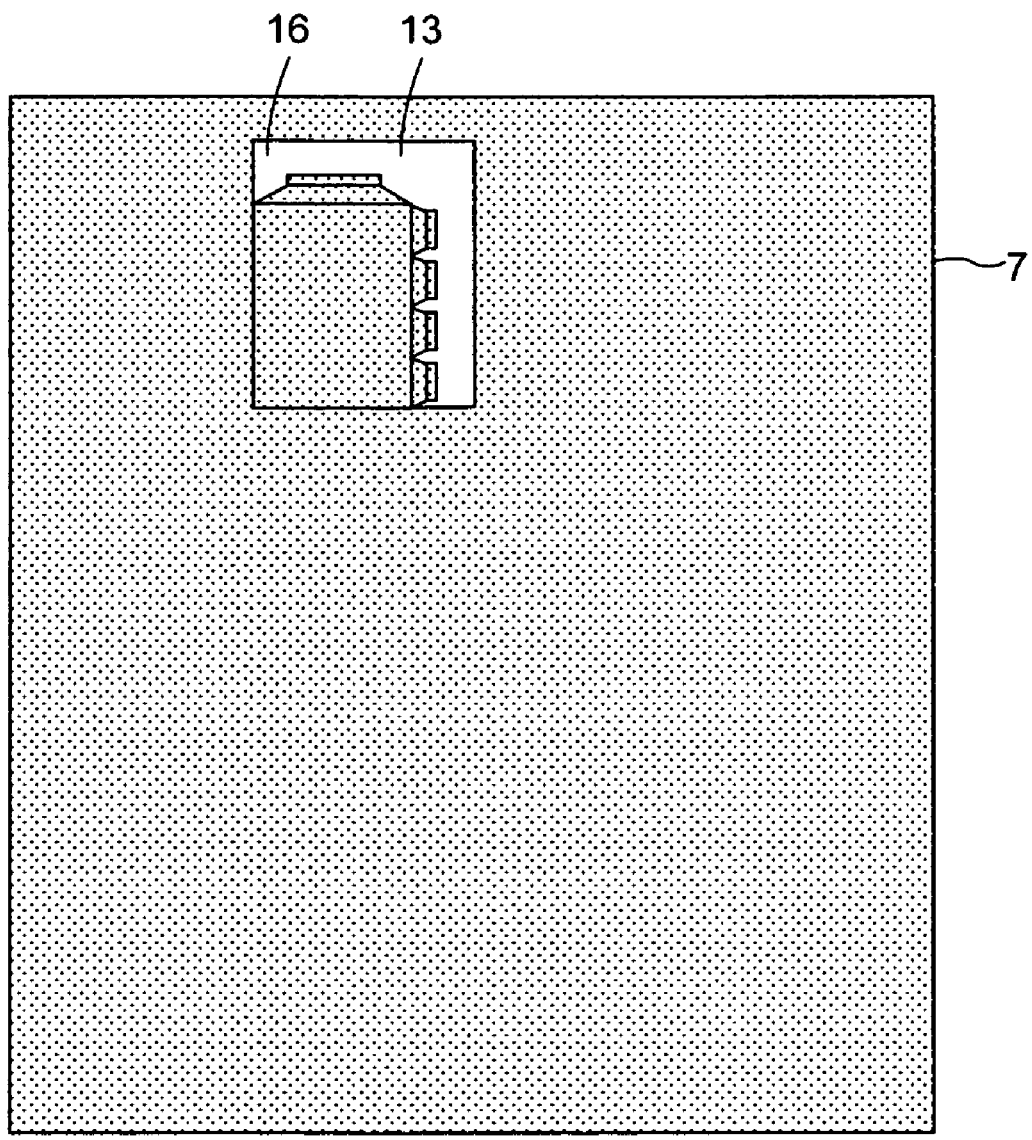
FIG. 9 shows another simulation patterns partially formed on a substrate by the method of simulating patterns shown in FIG. 7.

A pattern simulation method shown in FIGS. 7–9 is basically the same as that shown in FIGS. 1–6. However, a simulation computer simulates shooting exposure patterns 13 in neighboring regions on glass substrate 7 at the reversal of the first-fourth reticles 3–6 of reticle patterns 1 based on reticle data 11 and exposure data 12 and executes an AND logic operation for them so that light-shielding regions corresponding to those on glass substrate 7 which are not exposed through the first-fourth reticles 3–6 can be displayed on the monitor.

More concretely, exposure data 12 read out from an exposure data file are entered into the simulation computer (Step <11>) by reading in, and reticle data 11 are also read in by the computer (Step <12>). The computer simulates shooting exposure pattern 13 per shot on glass substrate 7 when a substrate pattern is formed on glass substrate 7 on simulation basis in response to reticle data 11 and exposure data 12 (Step <13>).

Here, Step <13> will be explained below with reference to FIGS. 8 and 9.

First, as shown in FIG. 8, the computer simulates the first exposure region 15 on glass substrate 7 to which light is applied as shooting exposure pattern 13 formed by the reversal of a light-shielding pattern of the first reticle 3 when the upper left side portion on glass substrate 7 is exposed through the first reticle 3.

Subsequently, as shown in FIG. 9, the computer further simulates the second exposure region 16 on glass substrate 7 to which light is applied as shooting exposure pattern 13 formed by the reversal of a light-shielding pattern of the second reticle 4 when the upper left side portion on glass substrate 7 is exposed through the first reticle 3.

A result of exposure through the second reticle 4 after exposure through the first reticle 3 is equal to that of the execution of an AND logic operation for the first and second exposure regions 15 and 16. This is because photoresist on glass substrate 7 disappears even if light is applied to it only once and a light-shielding region on glass substrate 7 is left in the case no light is applied to the light shield region.

Consequently, the computer prepares shooting exposure patterns 13 exposed through the first-fourth reticles 3–6, executes an AND logic operation for them in order (Step <14>) and simulates light-shielding regions to which no light is applied at a plurality of shots exposed through the first-fourth reticles 3–6 (Step <15>).

Thus, in the simulation method shown in FIGS. 7–9, since the AND logic operation is executed for each shooting exposure pattern 13 at every shot when each of the first-fourth reticles 3–6 is reversed in accordance with reticle data 11 and exposure data 12, light-shielding regions on glass substrate 7 to which no light is applied through each of the first-fourth reticles 3–6 are simulated and displayed. This pattern simulation method performs substantially the same function and effect as that shown in FIGS. 1–6.

Figure 10:
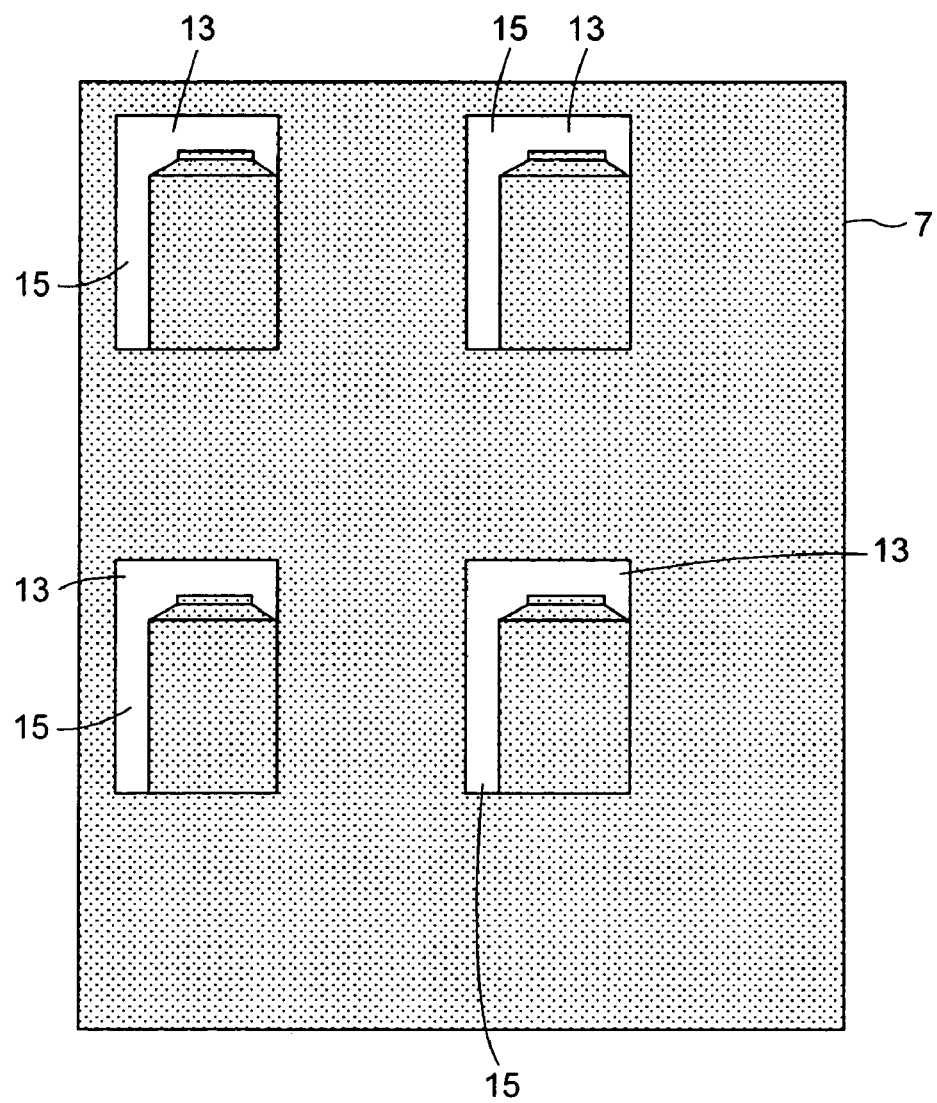
FIG. 10 shows simulation patterns partially formed on a substrate by a method of simulating patterns in accordance with third embodiment of the present invention.
Figure 11:
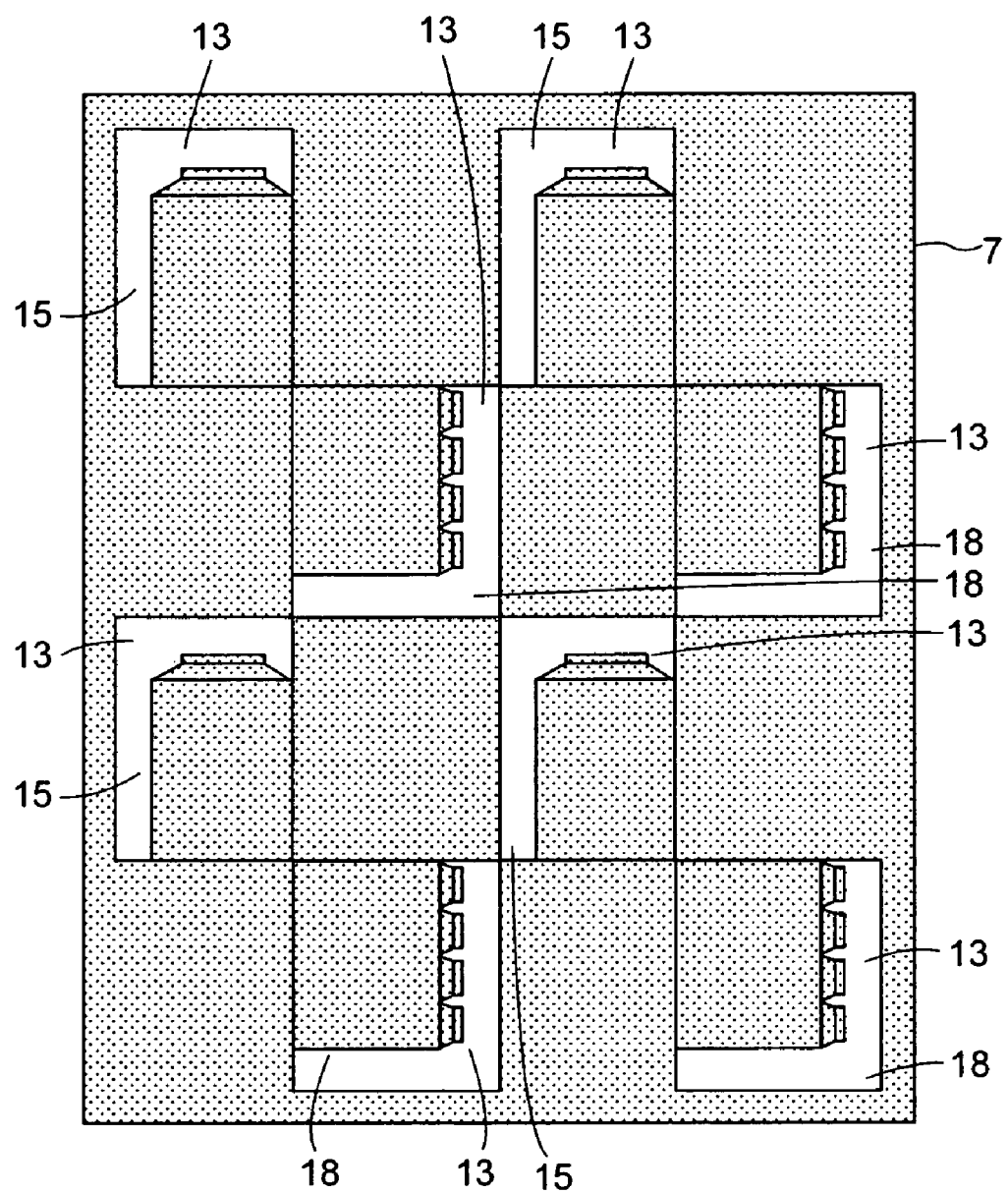
FIG. 11 shows further simulation patterns partially formed on a substrate by the method of simulating patterns shown in FIG. 10.
Figure 12:
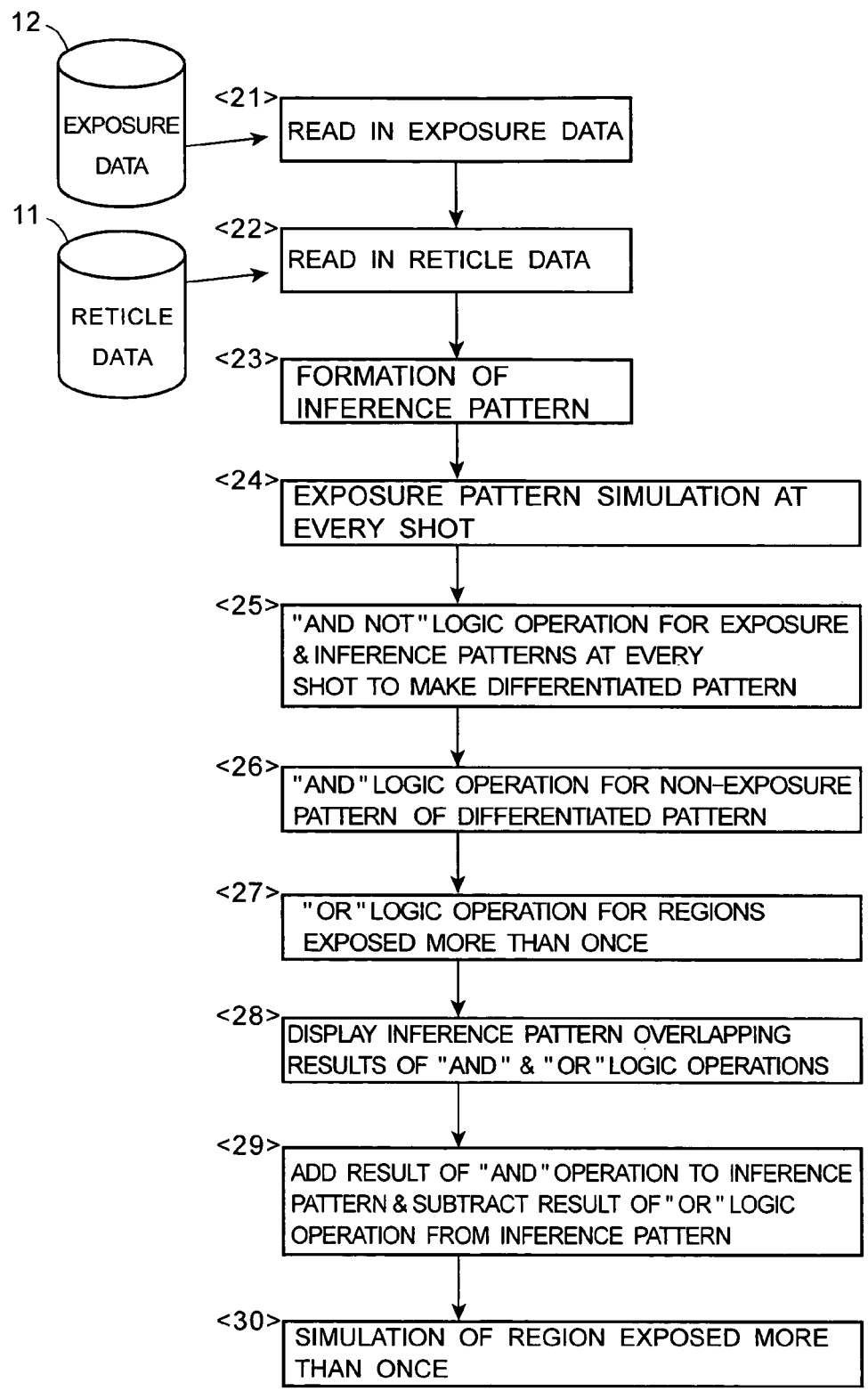
FIG. 12 is a flow chart of a method of simulating patterns in accordance with the fourth embodiment of the present invention.
Figure 13:
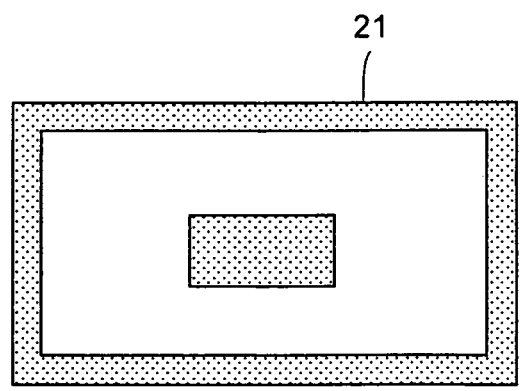
FIG. 13 shows an inferred pattern formed on a substrate by the method of simulating patterns shown in FIG. 12.
Figure 14:
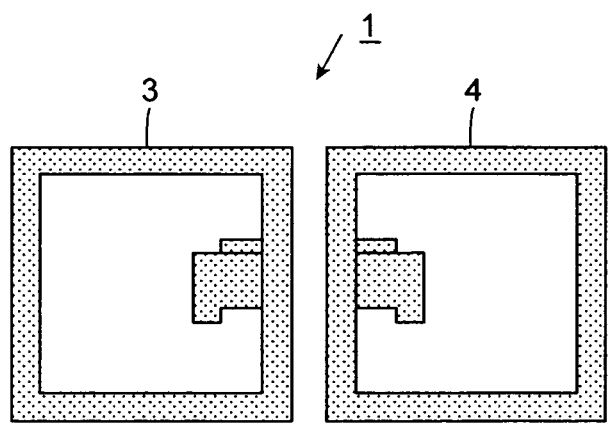
FIG. 14 shows reticles used for the method of simulating patterns shown in FIG. 12.

In the second embodiment, the AND logic operation is executed for exposure patterns 13 corresponding to those in neighboring regions on glass substrate 7, each of which is reversed to the first, second, third or fourth reticles 3, 4, 5 or 6 of reticle patterns 1 so that light-shielding regions corresponding to those on glass substrate 7 which are not exposed through the first-fourth reticles 3–6 are displayed on the monitor. As shown in FIGS. 10 and 11, in the third embodiment of the present invention, since exposure priority is given to non-neighboring regions formed on glass substrate 7, an AND logic operation can be collectively executed for data of a plurality of exposure patterns 13 exposed through the first-fourth reticles 3–6, respectively, as exposure data 12.

An AND logic operation is unnecessary in the case that no exposures are overlapped. The computer simulates that, after an exposure is simultaneously carried through the first reticles 3 in LCD panels 8 as shown in FIG. 10, exposure regions are also simultaneously done through the second-fourth reticles 4–6 in LCD panels 8, respectively. Then, an AND logic operation is executed for exposure regions 15 and 16 corresponding to those exposed through the first and second reticles 3 and 4, respectively. Similarly, the AND operation is executed for exposure regions 16 and 17 corresponding to those exposed through the second and third reticles 4 and 5, respectively. Further, the AND logic operation is executed for exposure regions 17 and 18 corresponding to those exposed through the third and fourth reticles 5 and 6, respectively.

Subsequently, another AND logic operation is collectively executed for patterns corresponding to those exposed through the first-fourth reticles 3–6, respectively. As a result, computer simulation photomasks can be verified satisfactorily with those AND logic operations executed for patterns that are subject to four shots (exposures). Generally, it is quite important for a verification tool by pattern processing operations, such as a presently main stream hierarchy type verification system, to reduce operation times and a processing period of time even in a large scale pattern processing case. The third embodiment of the present invention complies with such requirements.

Further, when exposures are carried out through the first-fourth reticles 3–6 of each LCD panel 8 divided in horizontal and vertical directions on glass substrate 7, two exposure regions arranged in diagonal places among exposure regions 15 through 18 are in contact with each other at one point which is subject to multiple exposures and if exposure pattern 13 does not exist there, a simultaneous shot can be performed for the two exposure regions in diagonal places.

In other words, since simultaneous shots are carried out though the first and third reticles 3 and 5 and through the second and fourth reticles 4 and 6, respectively, two AND logic operations are carried out for the first and third exposure regions 15 and 17, and the second and fourth exposure regions 16 and 18 to complete the entire exposure, respectively. In the case of glass substrate 7 used for a TFT array substrate of an LCD device, particularly, it is divided into four shots or less so that logic operations for shots can be four times or less despite the figures of its division lines 9 drawn on glass substrate 7.

The embodiments are directed to large glass substrate 7 used for four divided LCD panels 8 but they are also applicable to a small glass substrate used for LCD panels with no division line.

Now, the fourth embodiment of the present invention will be explained with reference to FIGS. 12–19.

A pattern simulation method shown in FIGS. 12–19 and simulated by a simulation computer is basically the same as that shown in FIGS. 1–6. The computer in this embodiment, however, simulates an inference pattern 21 on the assumption that a substrate pattern is formed on glass substrate 7 based on reticle data 11 and exposure data 12, executes logic operations for inference pattern 21 and exposure pattern 13 corresponding to that formed on glass substrate 7 and displays entire exposure pattern 14 of regions exposed on glass substrate 7 on a simulation monitor.

More concretely, the computer reads in exposure data 12 and reticle data 11 from exposure and reticle data files (Steps <21> and <22>), respectively, and draws inference pattern 21 on the assumption that a substrate pattern is formed on glass substrate 7 based on reticle data 11 and exposure data 12 (Step <23>).

Figure 15:
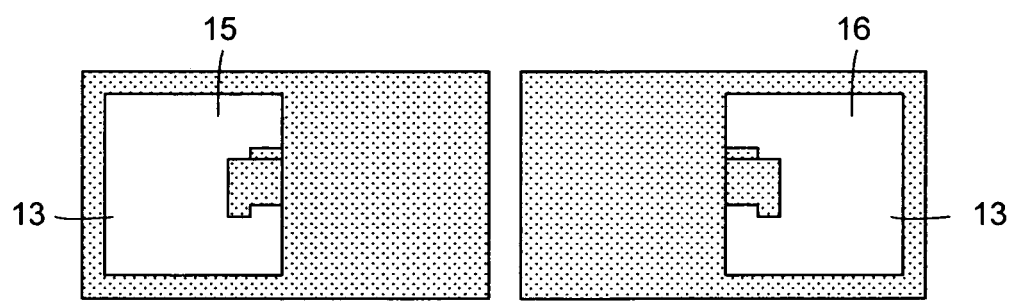
FIG. 15 shows exposure patterns for shots used in the method of simulating patterns shown in FIG. 12.

Then, as shown in FIG. 15, based on reticle data 11 and exposure data 12 the computer simulates exposure patterns 13 exposed through the first and second reticles 3 and 4, respectively, when the substrate pattern is formed on glass substrate 7 (Step <24>).

Figure 16:
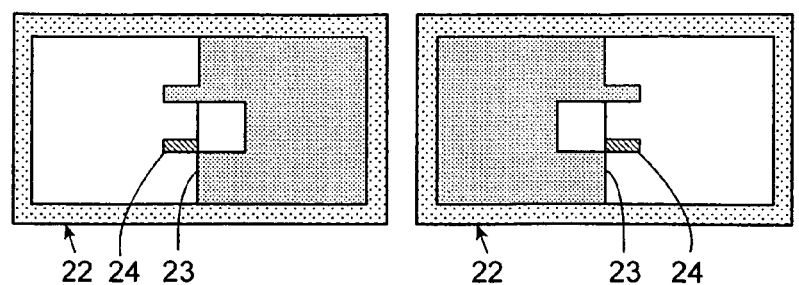
FIG. 16 is differentiated patterns used in the method of simulating patterns shown in FIG. 12.

Next, the computer executes AND NOT logic operations for inference pattern 21 formed at Step <23> and each exposure pattern 23 formed at Steps <24> to make differentiated patterns 22 as shown in FIG. 16, respectively (Step <25>).

Let pattern 23 be a pattern which exists in pattern 13 in differentiated pattern 22 but does not exist in inference pattern 21. Also, let pattern 24 be a pattern which does not exist in pattern 13 in differentiated pattern 22 but exists in inference pattern 21. Although pattern 23, on one hand, does not exist in inference pattern 21, it is a non-exposure region to which light is never applied. Although pattern 24, on the other hand, exists in inference pattern 21, it is a light applied and exposed region.

Figure 17:
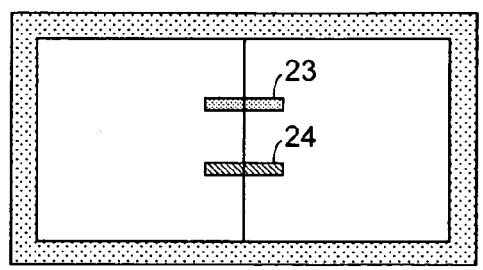
FIG. 17 shows patterns resulting from AND and OR logic operations of the differentiated patterns shown in FIG. 12.

Thus, as shown in FIG. 17, an AND logic operation is carried out for patterns 23 in differentiated patterns 22 together to display a region to which light is not applied even once (Step <26>). An OR logic operation is carried out for patterns 24 in differentiated patterns 22 together to display a region to which light is applied more than once (Step <27>).

Figure 18:
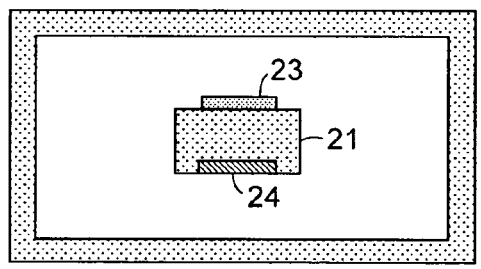
FIG. 18 shows a pattern overlapping those shown in FIG. 17 by overlapping with an inferred one.

Then, results obtained from the AND and OR logic operations at Steps <26> and <27>, respectively, are overlapped and displayed with inference pattern 21 as shown in FIG. 18 (Step <28>).

Figure 19:
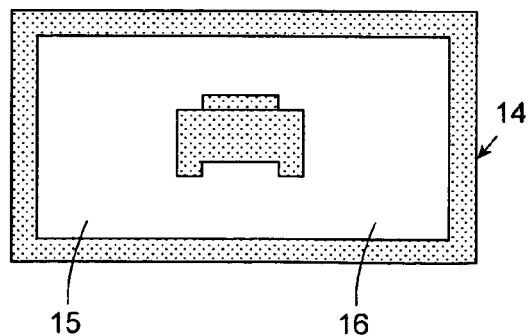
FIG. 19 shows patterns adding the inferred one to those resulting from AND logic operation and deleting those resulting from OR logic operation therefrom in the method of simulating patterns shown in FIG. 12.

Under this condition, as shown in FIG. 19, the result obtained from the AND logic operation at Step <26> is added to inference pattern 21, the result obtained from the OR logic operation at Step <27> is deleted or subtracted from inference pattern 21, and results from these AND and OR logic operations which are overlapped and displayed with inference pattern 21 are processed.

As a result, the computer simulates and displays entire exposure pattern 14 to which light is applied more than once at the time when the substrate pattern is formed on glass substrate 7 through the first and second reticles 3 and 4 <Step 30>.

In the pattern simulation method shown in FIGS. 12–19, inference pattern 21 is drawn on the assumption that a substrate pattern is formed on glass substrate 7 based on reticle data 11 and exposure data 12. Logic operations are then carried out for inference pattern 21 and exposure pattern 13 formed on glass substrate 7. Entire exposure pattern 14 corresponding to that exposed through the first and second reticles more than once on glass substrate 7, respectively, can be displayed as a simulation result pattern. In other words, this method simulates exposure patterns with substantially the same function and effect as that shown in FIGS. 1–6.

Further, the more inference pattern 21 made in advance based on reticle data 11 and exposure data 12 is approximate to entire pattern 14 actually exposed on glass substrate 7, the less a quantity of pattern data processing is necessary for AND NOT, AND and OR logic operations in the final step, respectively. If inference pattern 21 is closer to actual entire exposure pattern 14, design defects of reticle data 11 and exposure data 12 can be more quickly and accurately detected and reticle patterns can be checked in a shorter time because a quantity of pattern data processing is less. The present invention is effectively applicable to a large size LCD device because, generally, a pattern with a panel or substrate size is drawn and a plurality of its divisions are determined in view of sizes and figures of reticle patterns 1 and portions exposed through reticle patterns 1 so that inference pattern 21 is very approximate to actual exposure pattern 14.

In the fourth embodiment, the simulation is carried out for glass substrate 7 divisionally exposed through the first and second reticles 3 and 4. The fifth embodiment shown in FIGS. 20–25, however, substantially performs the same function and achieves the same effect as the fourth embodiment even in the case that a substrate is exposed through four divided cross reticles, i.e., the first-fourth reticles 3–6.

Figure 20:
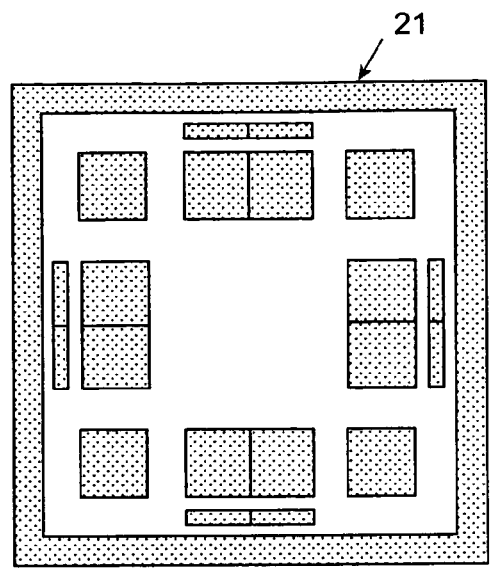
FIG. 20 shows an inferred pattern formed on the substrate by a method of simulating patterns in accordance with the fifth embodiment of the present invention.
Figure 21:
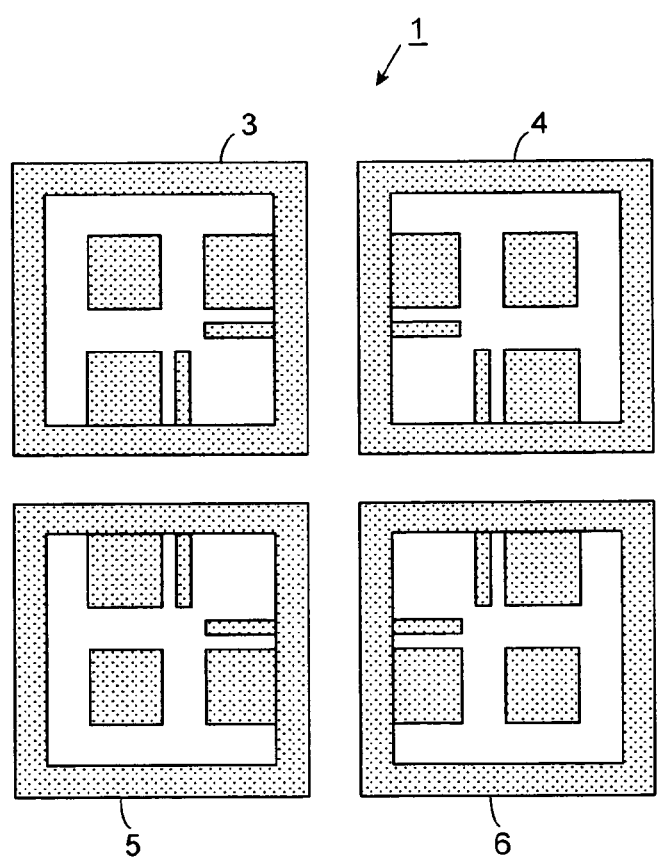
FIG. 21 shows reticle patterns used for the method of simulating patterns shown in FIG. 20.
Figure 22:
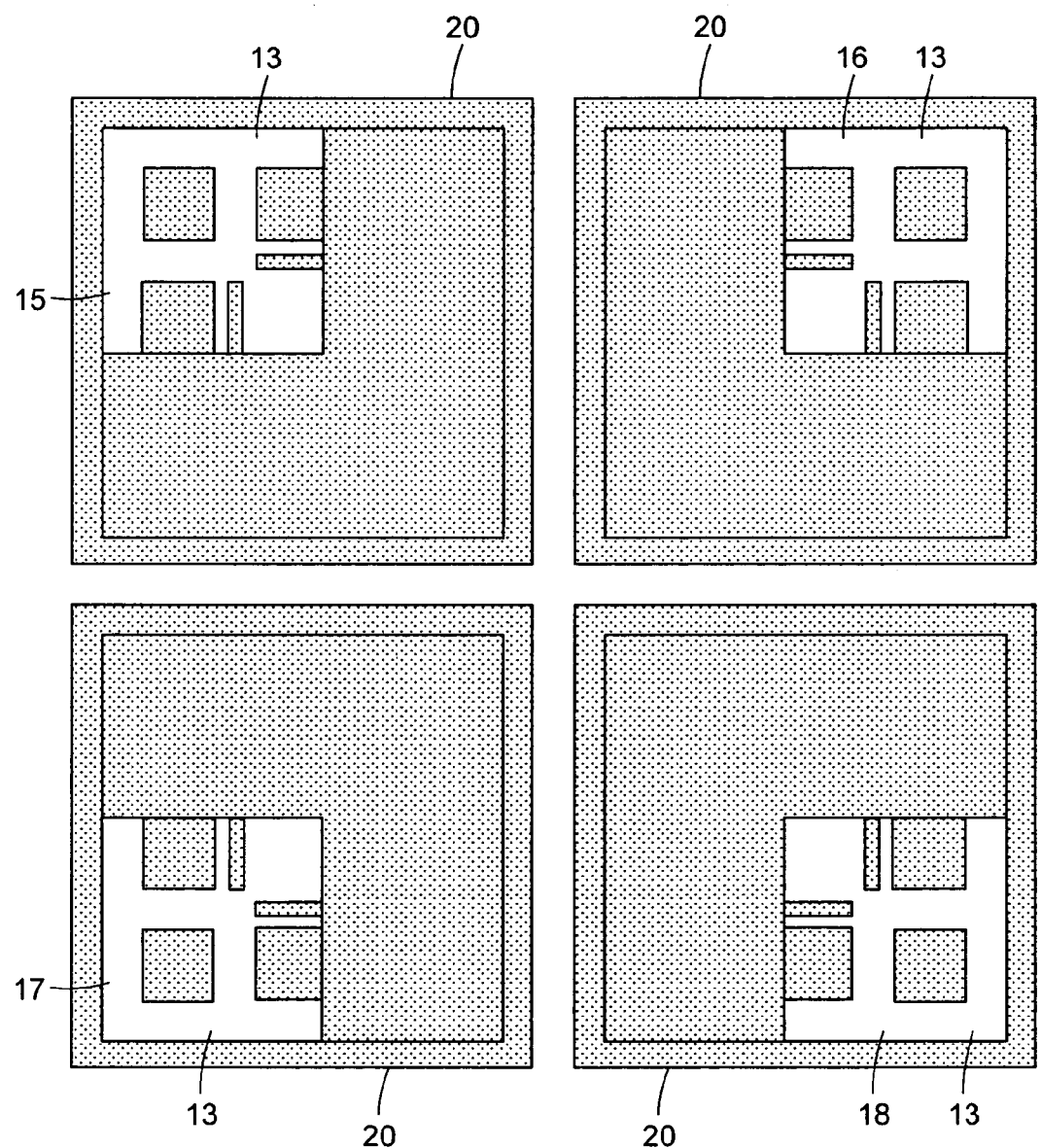
FIG. 22 shows exposure patterns for shots used for the method of simulating patterns shown in FIG. 20.
Figure 23:
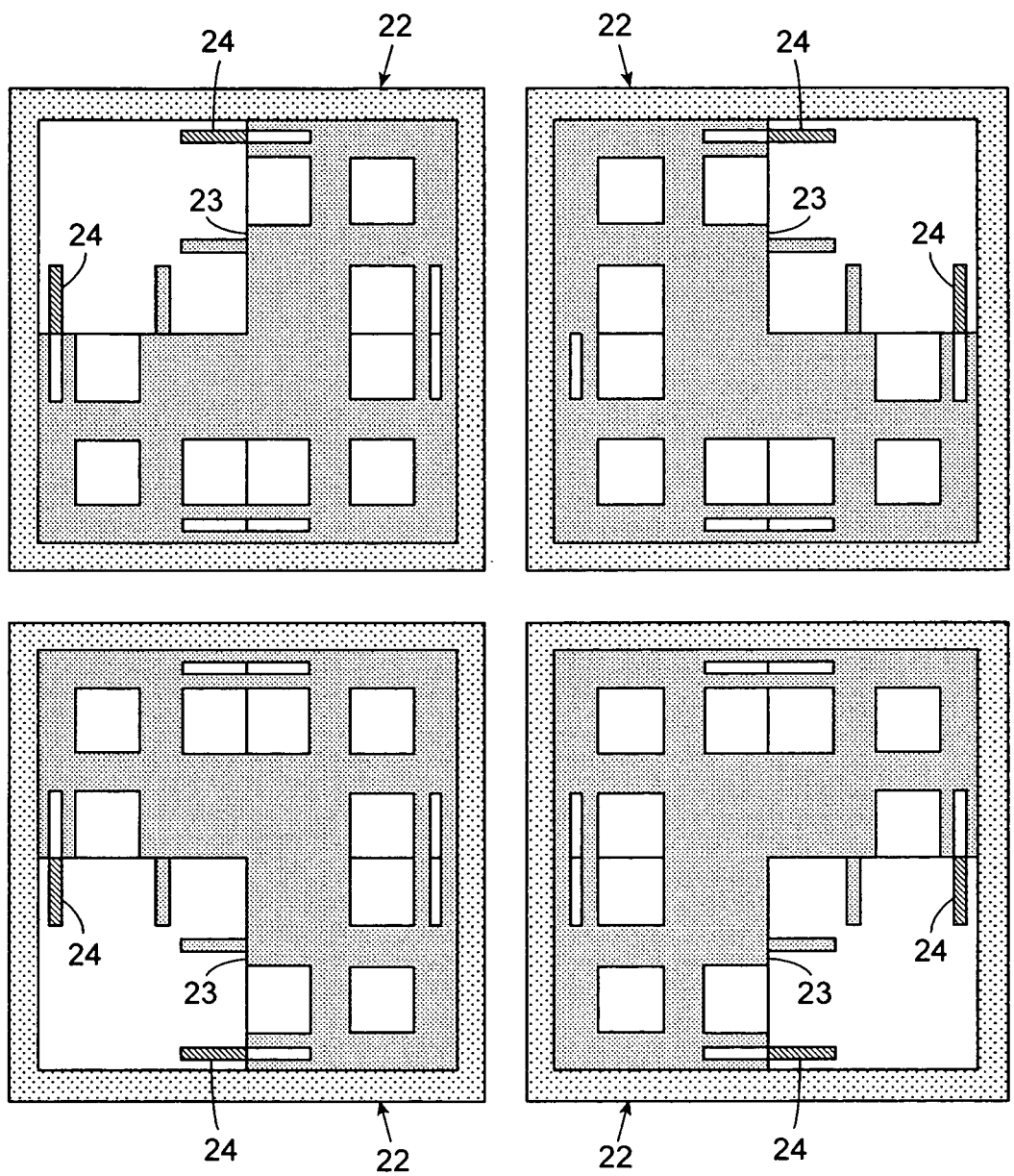
FIG. 23 shows differentiated patterns used for the method of simulating patterns shown in FIG. 20.
Figure 24:
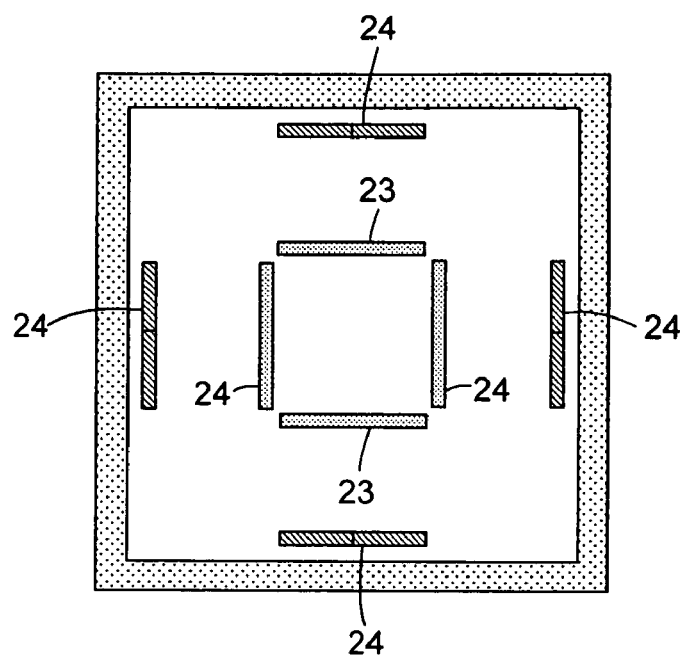
FIG. 24 shows patterns resulting from AND and OR logic operations of the differentiated ones shown in FIG. 23.

As shown in FIG. 20, inference pattern 21 is formed in advance and, then, the first-fourth reticles 3–6 shown in FIG. 21 are used to form entire exposure pattern 20 with a substrate size for simulation as shown in FIG. 22, respectively. Subsequently, AND NOT logic operations are executed for inference pattern 21 and exposure pattern 13 of the first, second, third or fourth reticle 3, 4, 5 or 6 to obtain differentiated patterns 22 as shown in FIG. 23. Further, AND logic operations are executed for patterns 23 in differentiated patterns 22 and OR logic operations are executed for patterns 24 in differentiated patterns 22 so that they form a pattern shown in FIG. 24. Next, results from these AND and OR logic operations are added to inference pattern 21 while those from OR logic operations are subtracted from inference pattern 21. As a result, a simulation pattern shown in FIG. 25 is obtained corresponding to entire patterns 14 exposed through each of the first-fourth reticles 3–6 more than once.

Further, in this fifth embodiment, exposure patterns 13 with a substrate size for simulation are made by using the first-fourth reticles 3–6, respectively, and AND NOT logic operations are executed for exposure patterns 13 and inference pattern 21 over all regions in glass substrate 7. In the sixth embodiment shown in FIGS. 26–30, however, AND OR logic operations are executed for inference pattern 21 and effective regions corresponding to those on glass substrate 7 to which light are applied through the first-fourth reticles 3–6, respectively. The sixth embodiment performs substantially the same function and effect as the fifth embodiment.

Figure 25:
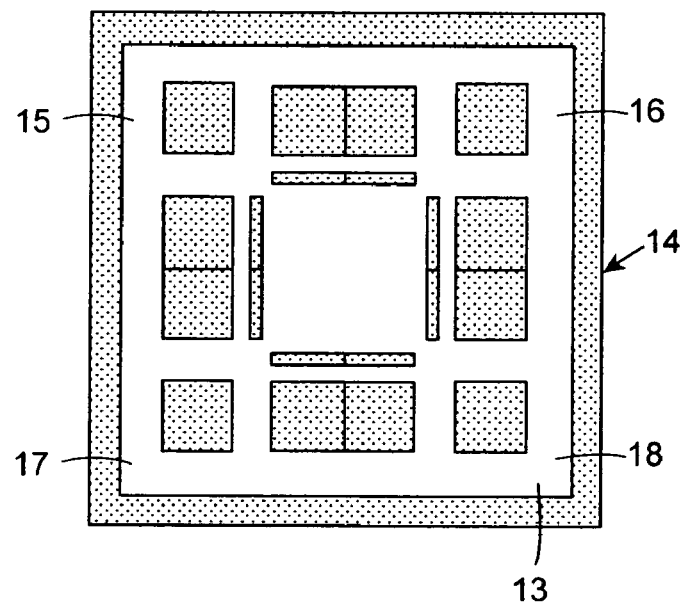
FIG. 25 shows patterns adding those resulting from AND logic operation of the differentiated ones to the inferred one and deleting those resulting from OR logic operation of the differentiated ones therefrom in the method of simulating patterns shown in FIG. 23.
Figure 26:
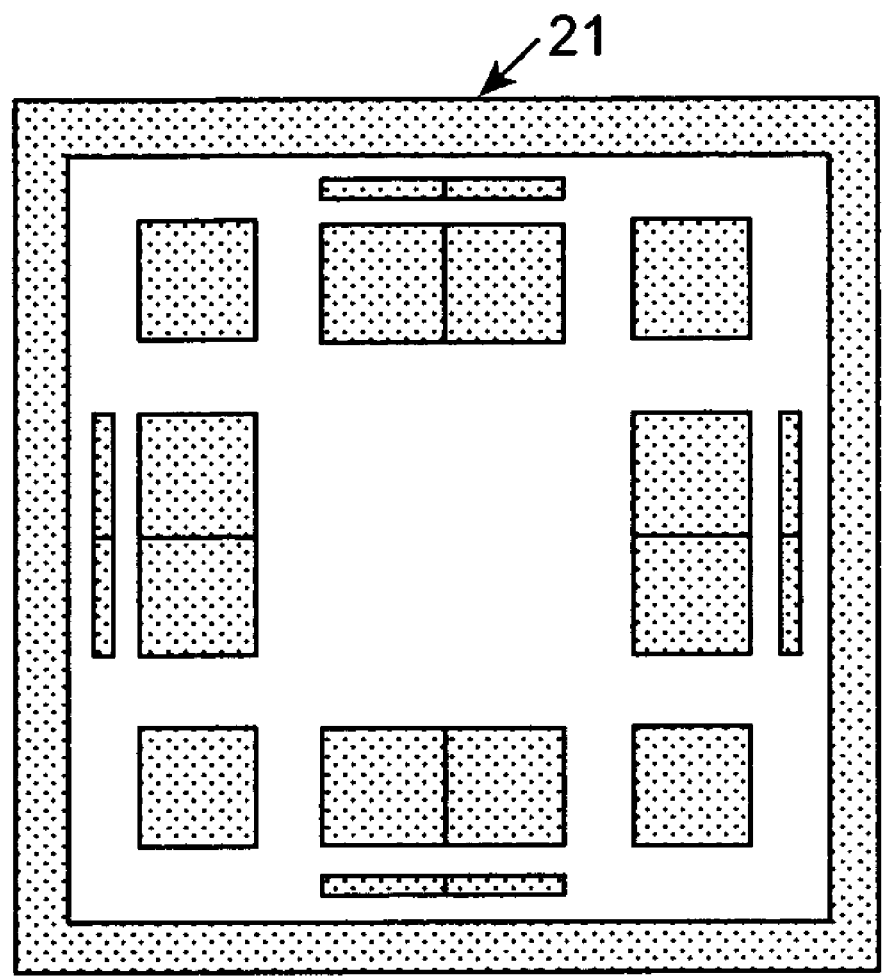
FIG. 26 is an inferred pattern made by using a method of simulating patterns in accordance with the sixth embodiment of the present invention.
Figure 27:
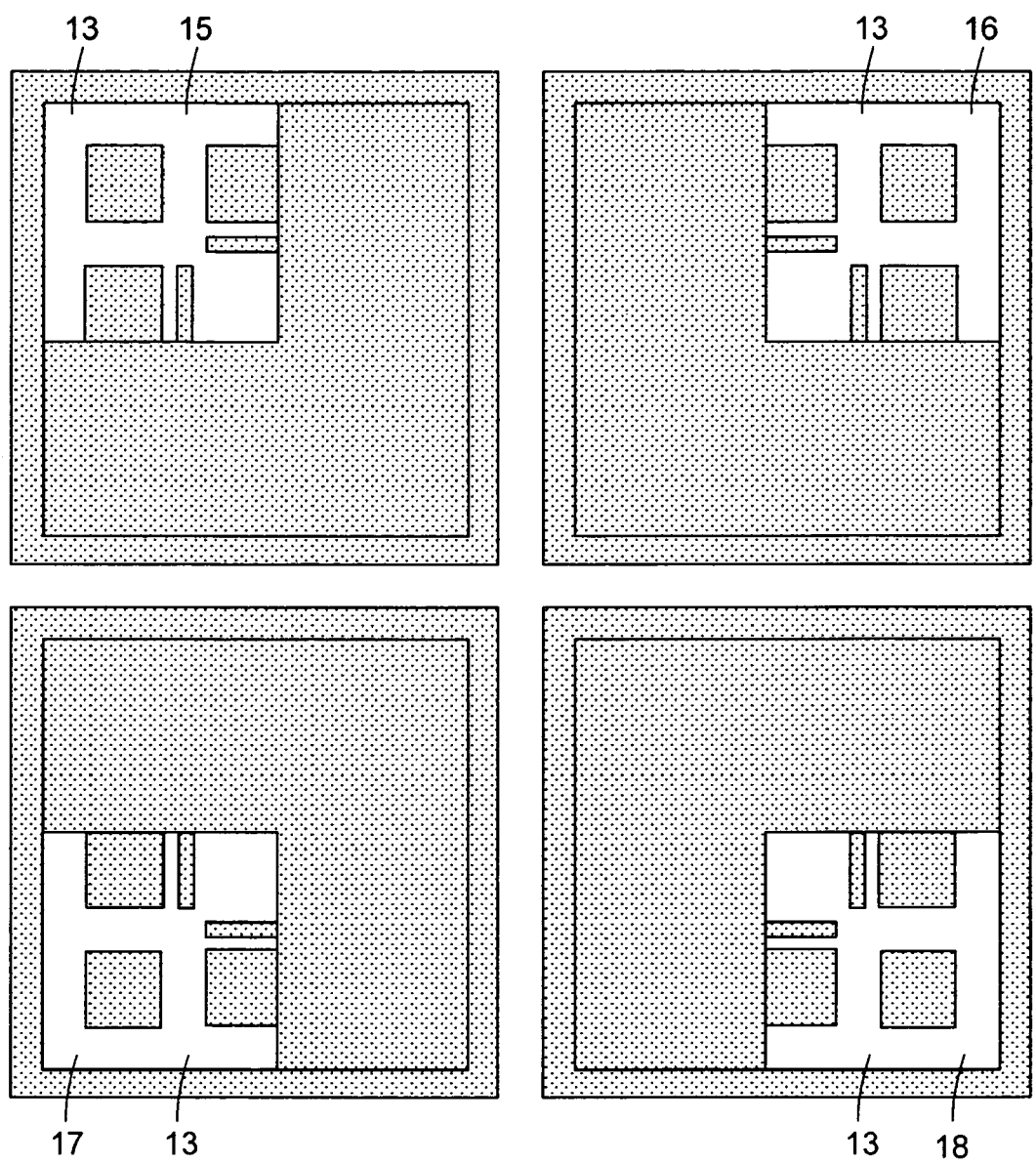
FIG. 27 shows exposure patterns for shots unsed for the method of simulating patterns shown in FIG. 26.
Figure 28:
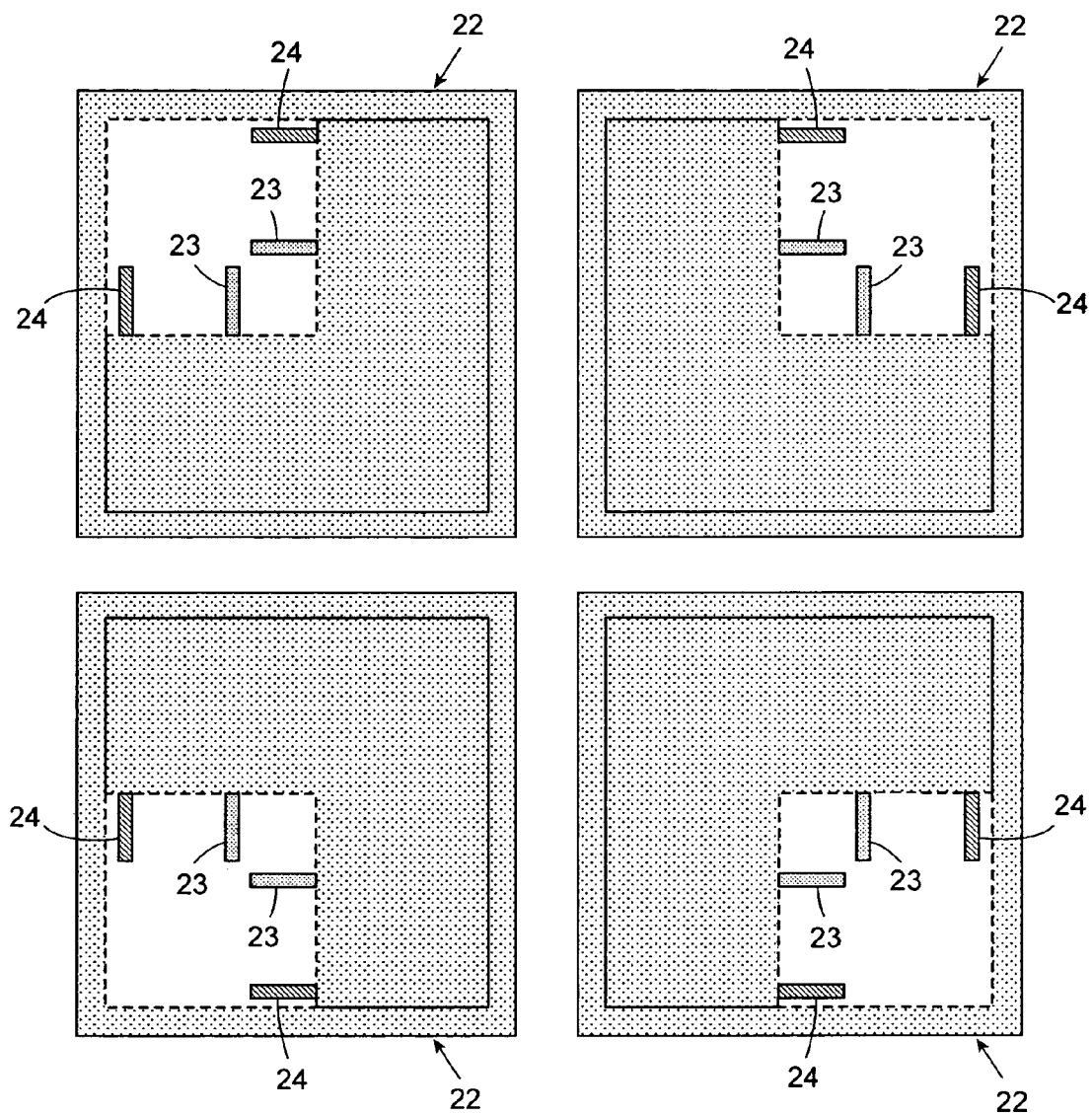
FIG. 28 shows differentiated pattern in only effective regions in the method of simulating patterns shown in FIG. 27.
Figure 29:
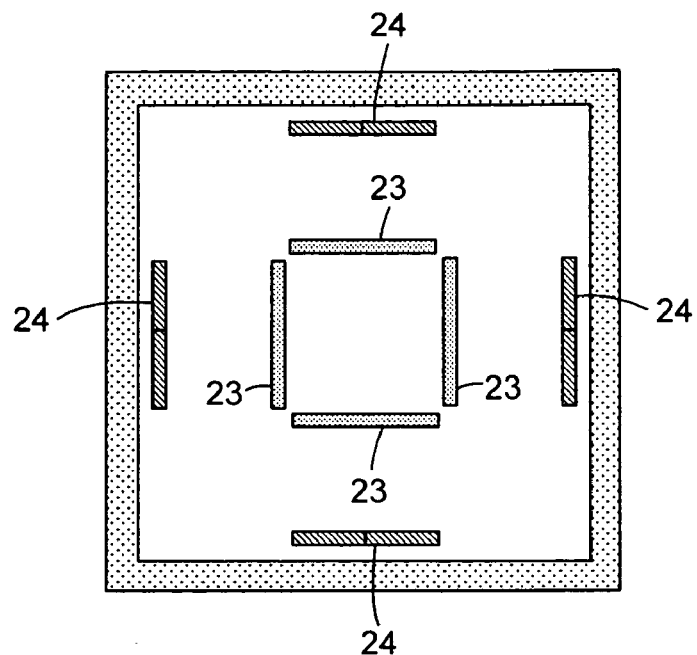
FIG. 29 shows patterns resulting from AND and OR logic operations of the differentiated ones in the method of simulating patterns shown in FIG. 20.
Figure 30:
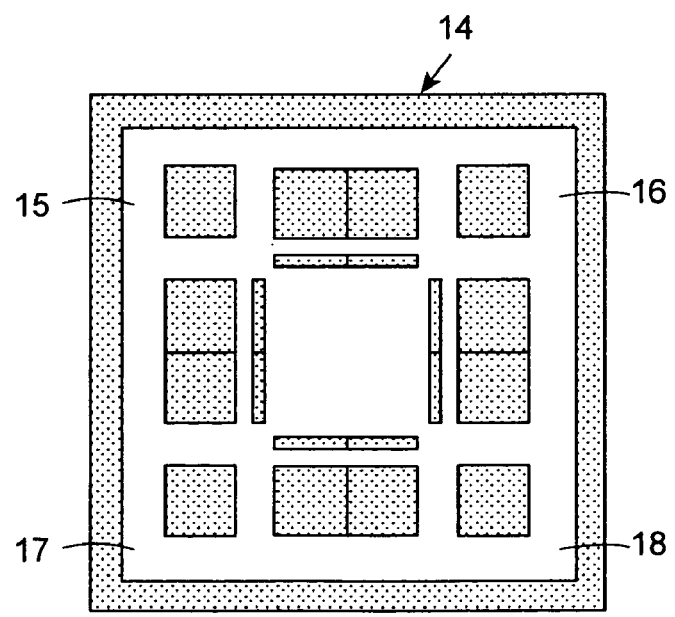
FIG. 30 shows patterns adding those resulting from AND logic operation of the differentiated ones to the inferred one and deleting those resulting from OR logic operation of the differentiated ones therefrom in the method of simulating patterns shown in FIG. 20.

More concretely, inference pattern 21 shown in FIG. 25 is formed in advance and, as shown in FIG. 27, exposure pattern 13 with a substrate size for simulation is made by using each of the first-fourth reticles 3–6. As shown in FIG. 28, AND NOT logic operations are then executed for inference pattern 21 and only effective regions in exposure patterns 13 on glass substrate 7 to which light are applied through the first-fourth reticles 3–6 to obtain differentiated patterns 22, respectively. Next, as shown in FIG. 29, AND logic operations are executed for patterns 23 in differentiated patterns 22 and OR logic operations are executed for patterns 24 in differentiated patterns 22. Results from these AND and OR logic operations are displayed together with inference pattern 21. As shown in FIG. 30, inference pattern 21 is added to the result of the AND logic operations, and inference pattern 21 is deleted or subtracted from the result of the AND logic operations so that entire patterns 14 corresponding to those exposed through the first-fourth reticles 3–6 more than once, respectively, are displayed as a result of simulation.

Thus, since AND NOT logic operations are executed for inference pattern 21 and only effective regions in exposure patterns 13 corresponding to those on glass substrate 7 to which light are applied through the first-fourth reticles 3–6 to obtain differentiated patterns 22, the regions subject to the AND NOT logic operations are reduced and a quantity of processing data is also reduced so that differentiated patterns 22 are made at much higher speed. Thus, design defects of reticle data 11 and exposure data 12 can be more quickly and accurately detected and reticle patterns can be checked in a shorter time.

Further, in the fourth through sixth embodiments, inference patterns 21 are added to the results from AND logic operations which are executed for patterns 23 in differentiated patterns 22, those from OR logic operations are executed for patterns 24 in differentiated patterns 22 are deleted or subtracted from inference pattern 21, and data overlapping inference pattern 21 with those obtained from these AND and OR logic operations are processed to simulate and display entire exposure patterns 14 corresponding to those on glass substrate 7 to which light are applied more than once. Without processing of inference pattern 21, however, it is possible to check entire exposure pattern 14 on glass substrate 7 in the case that results from AND logic operations executed for patterns 23 in differentiated patterns 22 and those from OR logic operations executed for patterns 24 in differentiated patterns 22 are only overlapped with inference pattern 21.

More particularly, results from AND logic operations executed for patterns 23 in differentiated patterns 22 are simply overlapped with inference pattern 21 as additional data and those from OR logic operations executed for patterns 24 in differentiated patterns 22 are processed to make them invisible on a monitor instead of canceling them as canceled data so that the results obtained from these AND and OR logic operations are overlapped with inference pattern 21 to display a simulation result pattern.

As a result, since it is possible to check entire exposure pattern 14 corresponding to those exposed on glass substrate more than once, this embodiment has substantially the same function and effect as the fourth, fifth and sixth embodiments. It is unnecessary to process an additional pattern and deletion pattern with respect to differentiated pattern 22 so that entire exposure pattern 14 corresponding to that on glass substrate 7 can be displayed very quickly and these data are easily handled.

Further, differentiated pattern 22 between inference pattern 21 and a simulation pattern of exposure patterns 13 corresponding to those exposed on glass substrate 7 through the first-fourth reticles 3–6 and inference pattern 21 may be overlapped for simulation display, and differentiated pattern 22 may be processed with inference pattern 21. In this case, since a logic operation is necessary for a substrate size in glass substrate 7, its processing time is longer but its result is displayed at a high speed. Thus, this embodiment has substantially the same function and effect as the fourth, fifth and sixth embodiments.

According to the present invention, when a substrate pattern is formed on a substrate based on reticle and exposure data, an OR or AND logic operation is executed for a plurality of regions corresponding to those exposed on the substrate so that a pattern of the region exposed on the substrate more than once is simulated. Thus, design defects of the reticle and exposure data can be easily found by identifying regions on a simulation basis which are not exposed when a substrate pattern is formed on a substrate based on reticle and exposure data.

Further, an inference pattern is made when a substrate pattern is formed on a substrate based on reticle and exposure data and logic operations are executed for the inference pattern and exposure pattern formed on the substrate based on the reticle and exposure data to simulate a pattern of the regions exposed on the substrate. Alternatively, a differentiated pattern is formed to show a differentiation at the logic operation and the differentiated pattern is overlapped with the inference pattern or is subject to a logic operation to simulate the substrate pattern based on the reticle and exposure data. Thus, on a simulation basis, when the substrate pattern is formed on the substrate in accordance with the reticle and exposure data, portions not exposed or overlapped exposures on the substrate can be easily identified and checked and design defects of the reticle and exposure date can be also easily found.

What is claimed is:

1. A method of simulating substrate patterns, comprising:
preparing reticle data of reticle patterns for a plurality of divided regions of an entire pattern formed on a substrate;

preparing exposure data positioning said reticle patterns on said substrate for exposure; and executing an OR logic operation of patterns corresponding to regions exposed on said substrate through said reticle patterns to simulate patterns of regions exposed on said substrate more than once.

2. A method of simulating substrate patterns according to claim 1, further comprising;

executing an AND logic operation of patterns corresponding to regions exposed on said substrate through said reticle patterns to simulate patterns of regions which are not exposed on said substrate.

3. A method of simulating substrate patterns, comprising:

preparing reticle data of reticle patterns for a plurality of divided regions of an entire pattern formed on a substrate;

preparing exposure data positioning said reticle patterns on said substrate for exposure; and executing an AND logic operation of patterns corresponding to neighboring regions exposed on said substrate through said reticle patterns to simulate patterns of regions exposed on said substrate more than once.

4. A method of simulating substrate patterns according to claim 1, wherein said exposure data includes priority data to instruct exposure of non-neighboring regions exposed on said substrate through said reticle patterns.

5. A method of simulating substrate patterns, comprising:

preparing reticle data of reticle patterns for a plurality of divided regions of an entire pattern formed on a substrate;

preparing exposure data positioning said reticle patterns on said substrate for exposure;

making an inference pattern corresponding to a substrate pattern on the assumption that said substrate pattern is formed based on said reticle and exposure data; and executing a logic operation of said inference pattern and patterns corresponding to a substrate pattern formed in accordance with said reticle and exposure data.

6. A method of simulating substrate patterns according to claim 5, further comprising;

making differentiated patterns corresponding to differences between said inference pattern and said substrate pattern resulting from said executing of said logic operation;

executing logic operations of said differentiated patterns and patterns corresponding to exposure patterns exposed on said substrate through said reticle patterns executing logic operations of said inference pattern and said differentiated pattern to simulate a substrate pattern to be formed on said substrate in accordance with said reticle and exposure data.

7. A method of simulating substrate patterns, comprising:

preparing reticle data of reticle patterns for a plurality of divided regions of an entire pattern formed on a substrate;

preparing exposure data positioning said reticle patterns on said substrate for exposure;

making an inference pattern corresponding to a substrate pattern on the assumption that said substrate pattern is formed in accordance with said reticle and exposure data;

executing a logic operation of said inference pattern and patterns corresponding to a substrate pattern formed in accordance with said reticle and exposure data to make differentiated patterns to express difference between said inference pattern and patterns corresponding to exposure patterns of said substrate pattern; and overlapping said differentiated patterns with said inference pattern to simulate said substrate pattern.

8. A method of simulating substrate patterns, comprising:

preparing reticle data of reticle patterns for a plurality of divided regions of an entire pattern formed on a substrate;

preparing exposure data positioning said reticle patterns on said substrate for exposure;

making an inference pattern corresponding to a substrate pattern on the assumption that said substrate pattern is formed in accordance with said reticle and exposure data;

executing a logic operation of said inference pattern and patterns corresponding to a substrate pattern formed in accordance with said reticle and exposure data to make differentiated patterns to express difference between said inference pattern and patterns corresponding to exposure patterns of said substrate pattern; and executing logic operations of said differentiated patterns and said inference pattern to simulate said substrate pattern.

9. A method of simulating substrate patterns, comprising:

preparing reticle data of reticle patterns for a plurality of divided regions of an entire pattern formed on a substrate;

preparing exposure data positioning said reticle patterns on said substrate for exposure; and executing OR logic operations of patterns corresponding to exposure patterns formed on said substrate in accordance with said reticle and exposure data to simulate patterns of regions exposed on said substrate more than once.

10. A method of simulating substrate patterns according to claim 9, further comprising:

executing NOT logic operations of patterns corresponding to said exposure patterns formed on said substrate in accordance with said reticle and exposure data to simulate patterns of regions which are not exposed on said substrate.

11. A pattern simulation program, comprising:

reticle data of reticle patterns for a plurality of divided regions of an entire pattern formed on a substrate;

exposure data positioning said reticle patterns on said substrate for exposure; and an instruction of AND logic operations of patterns corresponding to neighboring regions exposed on said substrate through said reticle patterns to simulate patterns of regions exposed on said substrate more than once.

12. A pattern simulation program according to claim 11, wherein said exposure data include data of non-neighboring regions to which priority in exposure is given when said substrate pattern is exposed on said substrate through said reticle pattern.

13. A simulation program, comprising:

reticle data of reticle patterns for a plurality of divided regions of an entire pattern formed on a substrate;

exposure data positioning said reticle patterns on said substrate for exposure;

a first instruction for making an inference pattern corresponding to a substrate pattern on the assumption that said substrate pattern is formed based on said reticle and exposure data; and a second instruction for executing a logic operation of said inference pattern and patterns corresponding to a substrate pattern formed in accordance with said reticle and exposure data.

14. A simulation program according to claim 13, further comprising;
- a third instruction for making differentiated patterns corresponding to differences between said inference pattern and said substrate pattern resulting from said executing of said logic operation;
- a fourth instruction for executing logic operations of said differentiated patterns and patterns corresponding to exposure patterns exposed on said substrate through said reticle patterns
- a fifth instruction for executing logic operations of said inference pattern and said differentiated pattern to simulate a substrate pattern to be formed on said substrate in accordance with said reticle and exposure data.

15. A pattern simulation program, comprising:
- reticle data of reticle patterns for a plurality of divided regions of an entire pattern formed on a substrate;
- exposure data positioning said reticle patterns on said substrate for exposure;
- a first instruction for making an inference pattern corresponding to a substrate pattern on the assumption that said substrate pattern is formed in accordance with said reticle and exposure data;
- a second instruction for executing a logic operation of said inference pattern and patterns corresponding to a substrate pattern formed in accordance with said reticle and exposure data to make differentiated patterns to express difference between said inference pattern and patterns corresponding to exposure patterns of said substrate pattern; and
- a third instruction for overlapping said differentiated patterns with said inference pattern to simulate said substrate pattern.

16. A simulation program, comprising:
- reticle data of reticle patterns for a plurality of divided regions of an entire pattern formed on a substrate;
- exposure data positioning said reticle patterns on said substrate for exposure;
- a first instruction for making an inference pattern corresponding to a substrate pattern on the assumption that said substrate pattern is formed in accordance with said reticle and exposure data;
- a second instruction for executing a logic operation of said inference pattern and patterns corresponding to a substrate pattern formed in accordance with said reticle and exposure data to make differentiated patterns to express difference between said inference pattern and patterns corresponding to exposure patterns of said substrate pattern; and
- a third instruction for executing logic operations of said differentiated patterns and said inference pattern to simulate said substrate pattern.

17. A medium storing a pattern simulation program set forth in one of claims 9–16 in a computer readable form.

18. A pattern simulation apparatus for simulating a substrate pattern formed on a substrate; wherein said sumilating of said substrate pattern is carried out in accordance with a pattern simulation program set forth in one of claims 9–16.

* * * * *